(12) United States Patent
Mizukami et al.

(10) Patent No.: US 10,556,431 B2
(45) Date of Patent: Feb. 11, 2020

(54) ELECTROMECHANICAL TRANSDUCER ELEMENT, LIQUID DISCHARGE HEAD, LIQUID DISCHARGE DEVICE, AND LIQUID DISCHARGE APPARATUS

(71) Applicants: Satoshi Mizukami, Kanagawa (JP); Naoya Kondo, Kanagawa (JP); Toshiaki Masuda, Kanagawa (JP)

(72) Inventors: Satoshi Mizukami, Kanagawa (JP); Naoya Kondo, Kanagawa (JP); Toshiaki Masuda, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/015,613

(22) Filed: Jun. 22, 2018

(65) Prior Publication Data
US 2018/0370237 A1    Dec. 27, 2018

(30) Foreign Application Priority Data

Jun. 23, 2017 (JP) ................... 2017-123456
Mar. 5, 2018 (JP) ................... 2018-038206

(51) Int. Cl.
| B41J 2/14 | (2006.01) |
| H01L 41/047 | (2006.01) |
| H01L 41/317 | (2013.01) |
| H01L 41/187 | (2006.01) |
| H01L 41/257 | (2013.01) |
| H01L 41/09 | (2006.01) |

(52) U.S. Cl.
CPC ....... *B41J 2/14233* (2013.01); *H01L 41/0478* (2013.01); *H01L 41/0973* (2013.01); *H01L 41/1876* (2013.01); *H01L 41/257* (2013.01); *H01L 41/317* (2013.01)

(58) Field of Classification Search
CPC ............... B41J 2/14233; B41J 2/14201; B41J 2/14209; B41J 2/14274; H01L 41/0805; H01L 41/18; H01L 41/08; H01L 41/083; H01L 41/0831; H01L 41/0478; H01L 41/87; H01L 41/257; H01L 41/317; H01L 41/1876; H01L 41/0973
See application file for complete search history.

(56) References Cited

U.S. PATENT DOCUMENTS

| 8,454,133 B2 | 6/2013 | Mizukami et al. |
| 8,602,530 B2 | 12/2013 | Mizukami et al. |
| 8,727,505 B2 | 5/2014 | Mizukami et al. |
| 8,733,904 B2 | 5/2014 | Mizukami |
| 8,919,926 B2 | 12/2014 | Mizukami et al. |
| 8,926,069 B2 | 1/2015 | Ishimori et al. |
| 8,960,867 B2 | 2/2015 | Ishimori et al. |
| 9,168,744 B2 | 10/2015 | Mizukami et al. |
| 9,196,821 B2 | 11/2015 | Aoyama et al. |
| 9,199,458 B2 | 12/2015 | Kondo |
| 9,385,298 B2 | 7/2016 | Mizukami et al. |

(Continued)

FOREIGN PATENT DOCUMENTS

JP      2014-53480 A    3/2014

*Primary Examiner* — Juanita D Jackson
(74) *Attorney, Agent, or Firm* — Oblon, McClelland, Maier & Neustadt, L.L.P.

(57) ABSTRACT

An electromechanical transducer element including a lower electrode, an electromechanical transducer film and an upper electrode formed on the electromechanical transducer film.

12 Claims, 21 Drawing Sheets

(56) References Cited

U.S. PATENT DOCUMENTS

| | | |
|---|---|---|
| 9,401,471 B2 | 7/2016 | Mizukami et al. |
| 9,586,401 B2 | 3/2017 | Shinkai et al. |
| 9,597,872 B2 | 3/2017 | Mizukami |
| 9,627,606 B2 | 4/2017 | Mizukami |
| 9,889,654 B2 | 2/2018 | Mizukami et al. |
| 9,902,151 B2 | 2/2018 | Mizukami |
| 9,950,524 B2 | 4/2018 | Shinkai et al. |
| 9,956,774 B2 | 5/2018 | Mizukami |
| 9,969,161 B2 | 5/2018 | Shinkai et al. |
| 9,987,843 B2 | 6/2018 | Mizukami |
| 10,103,315 B2 | 10/2018 | Mizukami |
| 10,112,391 B2 | 10/2018 | Mizukami |
| 10,124,585 B2 | 11/2018 | Masuda et al. |
| 10,160,208 B2 | 12/2018 | Mizukami |
| 2005/0212867 A1* | 9/2005 | Nagashima ........... B41J 2/14233 |
| 2015/0022591 A1* | 1/2015 | Yamada .......................... 347/65 |
| 2015/0022592 A1* | 1/2015 | Aoyama et al. ................ 347/68 |
| 2015/0070444 A1 | 3/2015 | Ishimori et al. |
| 2015/0223491 A1 | 8/2015 | Frampton et al. |

\* cited by examiner

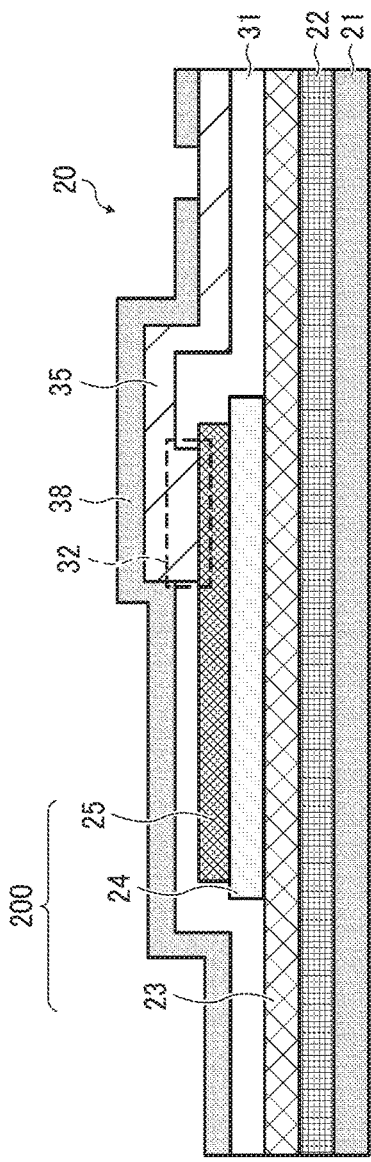
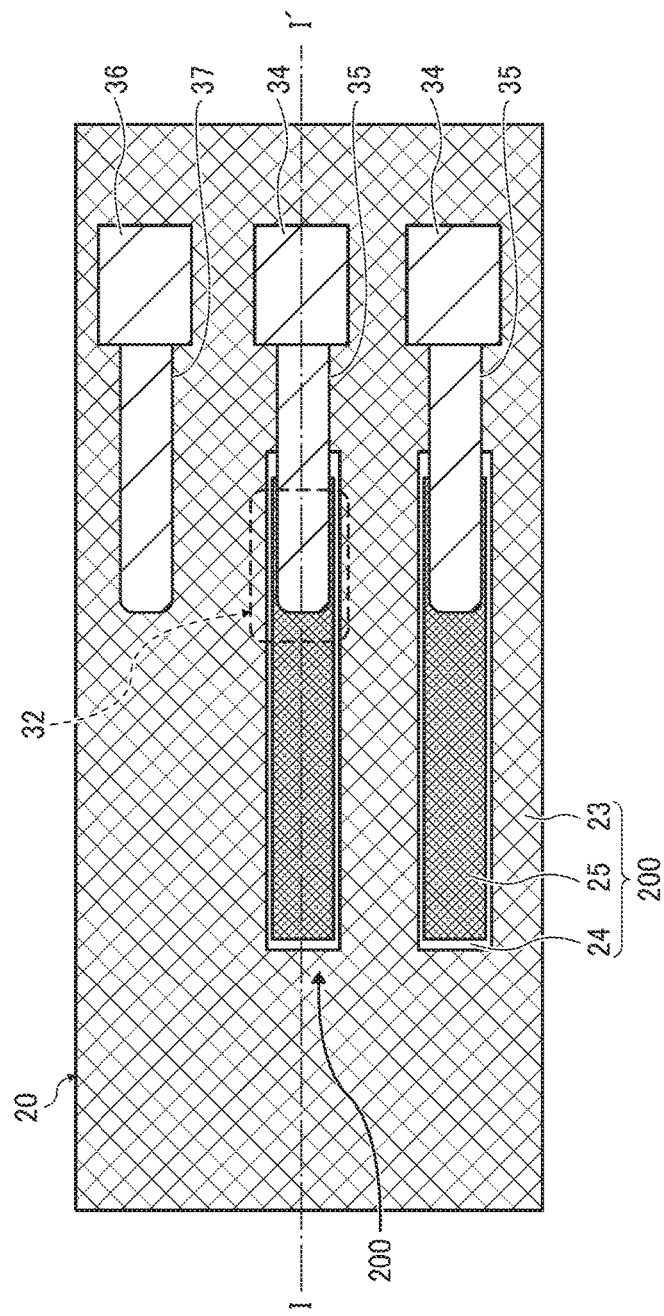
FIG. 3A
FIG. 3B

ELECTROMECHANICAL TRANSDUCER ELEMENT, LIQUID DISCHARGE HEAD, LIQUID DISCHARGE DEVICE, AND LIQUID DISCHARGE APPARATUS

CROSS-REFERENCE TO RELATED APPLICATIONS

This patent application is based on and claims priority pursuant to 35 U.S.C. § 119(a) to Japanese Patent Application Nos. 2017-123456, filed on Jun. 23, 2017, and 2018-038206, filed on Mar. 5, 2018, in the Japan Patent Office, the entire contents of which are incorporated herein by reference.

BACKGROUND

Technical Field

The present disclosure relates to an electromechanical transducer element, a liquid discharge head, a liquid discharge device and a liquid discharge apparatus.

Related Art

In the past, a known electromechanical transducer element includes a lower electrode formed directly or indirectly on a substrate, an electromechanical transducer film formed on the lower electrode and an upper electrode formed on the electromechanical transducer film. The electromechanical transducer film has a perovskite crystal structure such as lead zirconate titanate (PZT).

BRIEF DESCRIPTION OF THE DRAWINGS

A more complete appreciation of the present disclosure and many of the attendant advantages of the present disclosure can be understood by reference to the following detailed description when considered in connection with the accompanying drawings, wherein:

FIG. 3A is a cross-sectional view illustrating an example of a schematic configuration of an electromechanical transducer element of a liquid discharge head according to the present disclosure;

FIG. 3B is a plan view of the electromechanical transducer element illustrated in FIG. 3A;

DETAILED DESCRIPTION

Figure 1:
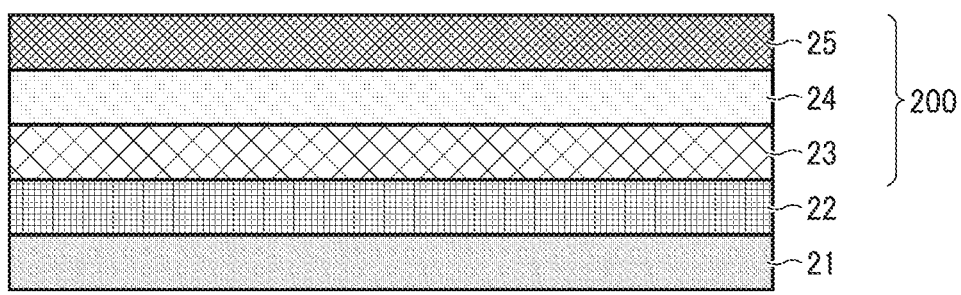
FIG. 1 is a cross-sectional view illustrating an example of a schematic configuration of an electromechanical transducer element according to the present disclosure.

In describing the drawings, specific terminology is employed for the sake of clarity. However, the present disclosure is not intended to be limited to the specific terminology so selected and it is to be understood that each specific element includes all technical equivalents that operate in a similar manner and achieve similar results.

Although the present disclosure is described with technical limitations with reference to the attached drawings, such description is not intended to limit the scope of the disclosure and all of the components or elements described in this disclosure are not necessarily indispensable.

Below, an electromechanical transducer element according to the present disclosure is described that is incorporated in a liquid discharge bead of an inkjet recording apparatus as a liquid discharge apparatus. Note that embodiments suggested and taught by the present disclosure are not limited to the following exemplary embodiments.

A liquid discharge head used in such an inkjet recording apparatus includes, for example, one or more nozzle rows.

In each nozzle row, a plurality of nozzles as discharge orifices to discharge droplets of liquid (e.g., ink) for image formation are arrayed in row. The liquid discharge head includes, e.g., a plurality of pressurizing liquid chambers communicated with the nozzles, respectively, and a plurality of pressure generators to generate pressure to discharge ink in the plurality of pressurizing liquid chambers. A pressure generator according to the present embodiment is a piezo-type pressure generator including a diaphragm plate and an electromechanical transducer element. The diaphragm plate is a displacement plate (deformable plate) constituting pan of a wall surface of a pressurizing liquid chamber, and includes a piezoelectric material to deform the diaphragm. When a predetermined voltage is applied to the electromechanical transducer element, the electromechanical transducer element deforms to displace a surface of the diaphragm plate toward the pressurizing liquid chamber, thus generating pressure in liquid in the pressurizing liquid chamber. The pressure allows liquid (ink droplets) to be discharged from a nozzle communicated with the pressurizing liquid chamber.

The piezoelectric material is a material having piezoelectric properties of being deformed by application of voltage. In the present embodiment, as the piezoelectric material, lead zirconate titanate (PZT: $Pb(Zr_x, Ti_{1-x})O_3$) is used that is a ternary metal oxide having a crystal structure of perovskite. There is a plurality of types of vibration modes on application oft drive voltage to the electromechanical transducer element including the electromechanical transducer film made of PZT (hereinafter, PZT film). Examples of variation modes include a vertical vibration mode (push mode) involving deformation in a film thickness direction with piezoelectric constant d33, a lateral vibration mode (bend mode) involving bending deformation with piezoelectric constant d31, and a shear mode utilizing shearing deformation of film.

For the electromechanical transducer element including the PZT film, as described below, pressurizing liquid chambers and electromechanical transducer elements can be directly built-in a Si substrate by using technologies of semiconductor processing and micro electro mechanical systems (MEMS). Accordingly, the electromechanical transducer elements can be formed as thin-film piezoelectric actuators to generate pressure in the pressurizing liquid chambers.

Figure 2:
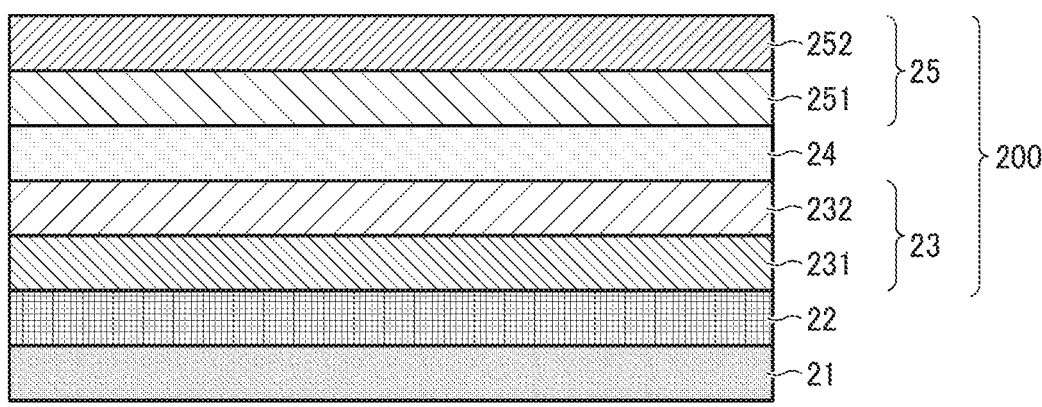
FIG. 2 is a cross-sectional view illustrating another example of a schematic configuration of an electromechanical transducer element according to the present disclosure.

FIG. 1 is a cross-sectional view illustrating an example of a schematic configuration of an electromechanical transducer element according to the present disclosure. FIG. 2 is a cross-sectional view illustrating another example of a schematic configuration of an electromechanical transducer element according to the present disclosure. In a configuration example of FIG. 1, a piezoelectric actuator 20 includes a substrate 21, a diaphragm 22, and an electromechanical transducer element 200 that are laminated in this order from the bottom thereof. The electromechanical transducer element 200 includes a lower electrode 23, an electromechanical transducer film 24, and an upper electrode 25. The lower electrode 23 as a first electrode is disposed above the substrate 21 with the diaphragm 22 interposed between the lower electrode 23 and the substrate 21. The electromechanical transducer film 24 is disposed on the lower electrode 23. The upper electrode 25 as a second electrode is disposed on the electromechanical transducer film 24.

The lower electrode 23 includes an electrode layer made of, e.g., a metal layer disposed directly under a lower face as a first surface of the electromechanical transducer film 24 or below the lower face of the electromechanical transducer film 24 with an intervening layer, such as a base layer, in between. The upper electrode 25 includes an electrode layer made of, e.g., a metal layer disposed directly on an upper face as a second surface of the electromechanical transducer film 24 or below the upper face of the electromechanical transducer film 24 with an intervening layer, such as a base layer, in between. Applying a voltage between the lower electrode 23 and the upper electrode 25 allows formation of an electric field in a film thickness direction of the electromechanical transducer film 24.

Here, each of the lower electrode 23 and the upper electrode 25 may be, e.g., a combination of a metal layer having a sufficiently small electric resistance and an oxide electrode film having conductivity. For example, in a configuration example of FIG. 2, the lower electrode 23 includes a metal layer 231 and an oxide electrode film 232 laminated on the metal layer 231. The metal layer 231 is disposed at a side closer to the diaphragm 22 and the oxide electrode film 232 is disposed at a side closer to the electromechanical transducer film 24. The upper electrode 25 includes an oxide electrode film 251 and a metal layer 252 laminated on the oxide electrode film 251. The oxide electrode film 251 is disposed at a side closer to the electromechanical transducer film 24. The oxide electrode film 232 and the oxide electrode film 251 are advantageous in suppressing a reduction in the amount of deformation (the amount of surface displacement) of the electromechanical transducer element 200 in continuous driving as the piezoelectric actuator. Each of the oxide electrode film 232 and the oxide electrode film 251 may be a seed layer made of for example, lead titanate (PT). Such a configuration more reliably suppresses a reduction in the amount of deformation (the amount of displacement of a surface) of the electromechanical transducer element 200.

FIG. 3A is a cross-sectional view illustrating an example of a schematic configuration of an electromechanical transducer element of a liquid discharge head according to the present disclosure. FIG. 3B is a plan view of the electromechanical transducer element illustrated in FIG. 3A. Note that, in FIG. 3B, a first insulating protective film (inter-layer insulating film) 31 and a second insulating protective film (inter-layer insulating film) 38 are omitted for ease of understanding of the configuration of the electromechanical transducer element 200. FIG. 3A is a cross-sectional view of the electromechanical transducer element 200 cut along line I-I' of FIG. 3B.

As illustrated in FIG. 3A, the piezoelectric actuator 20 includes the electromechanical transducer element 200. The electromechanical transducer element 200 includes the lower electrode 23, the electromechanical transducer film 24, and the upper electrode 25. As illustrated in FIG. 3B, a plurality of electromechanical transducer elements 200 having such a configuration is arrayed in a predetermined direction along a surface of the substrate 21. The plurality of electromechanical transducer elements 200 is disposed above the substrate 21 with the diaphragm 22 interposed in between.

Any one of the lower electrode 23 and the upper electrode 25 may be configured to be a common electrode shared by the plurality of electromechanical transducer elements 200. In such a configuration, the other of the lower electrode 23 and the upper electrode 25 is configured to be discrete electrodes that are separately disposed corresponding to the respective electromechanical transducer elements 200 and independent from each other. Note that, in the configuration example of FIGS. 3A and 3B, the lower electrode 23 is a common electrode and the upper electrode 25 is configured to be discrete electrodes that are separately disposed corresponding to the respective electromechanical transducer elements 200 and independent from each other.

A first insulating protective film 31 as an inter-layer insulating film is disposed on a predetermined area on the upper electrode 25 and the lower electrode 23. As described below, the first insulating protective film 31 may be made of inorganic compound. At a predetermined position of the first insulating protective film 31, a contact hole 32 is disposed to electrically connect the upper electrode 25 and the lower electrode 23 to other electrodes.

In FIGS. 3A and 3B, each upper electrode 25 as the discrete electrode is connected to a discrete electrode pad 34 to connect an external circuit. The upper electrode (discrete electrode) 25 and the discrete electrode pad 34 are electrically connected with, for example, a connector 35.

In FIGS. 3A and 3B, each lower electrode 23 as the common electrode is connected to a common electrode pad 36 to connect an external circuit. The lower electrode (common electrode) 23 and the common electrode pad 36 may be electrically connected with, for example, an inter-pad connector 37.

A second insulating protective film 38 is disposed on the common electrode pad 36 and the discrete electrode pad 34. As described below, the second insulating protective film 38 may be made of inorganic compound. The second insulating protective film 38 includes an opening portion through which each of the common electrode pad 36 and the discrete electrode pad 34 is partially exposed to the outside.

Next, a description is given of a method of performing polarization processing on an electromechanical transducer film 24 in a production process of the electromechanical transducer element 200 having the above-described configuration.

Figure 4:
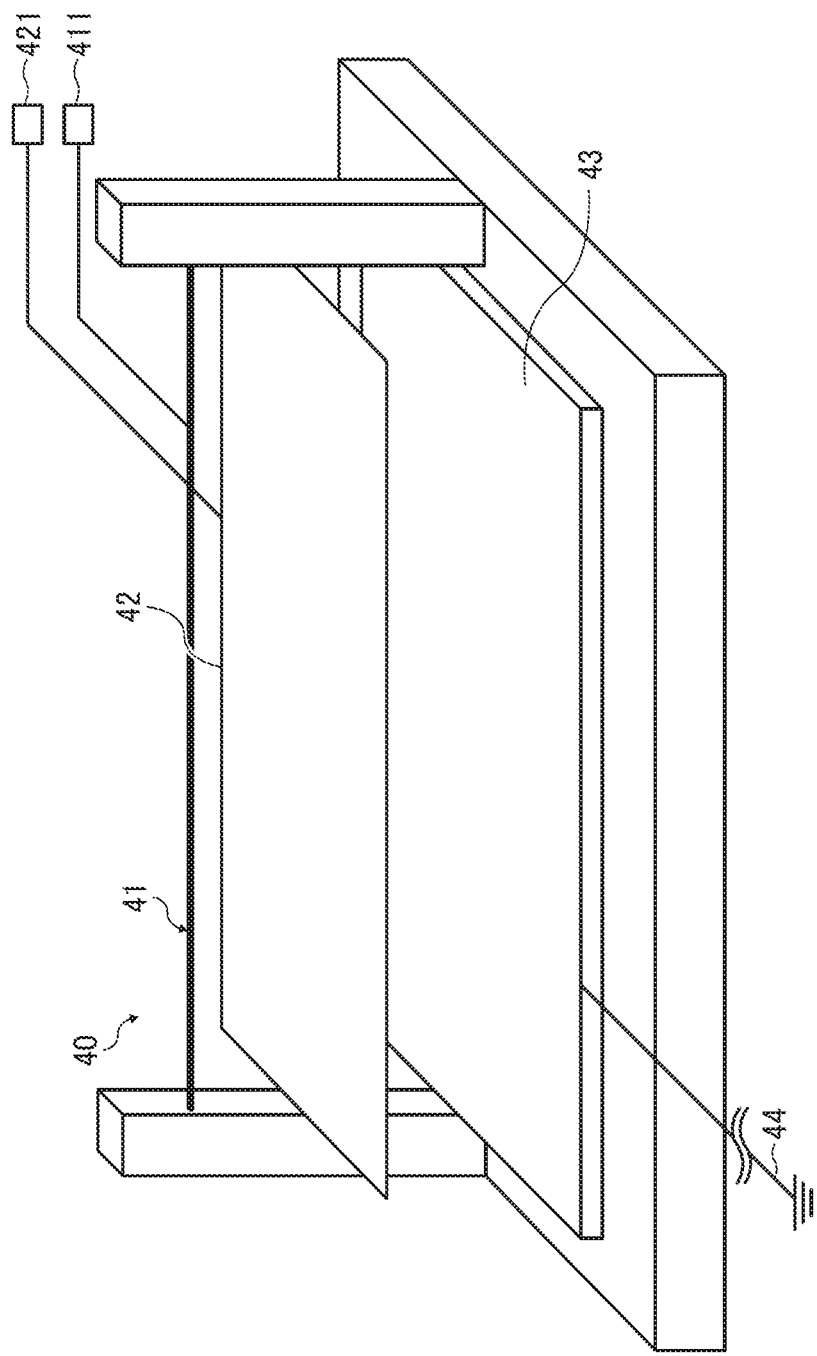
FIG. 4 is a perspective view illustrating an example of a polarization processing device.

FIG. 4 is a perspective view illustrating an example of a polarization processing device. In FIG. 4, the polarization processing device 40 includes a corona electrode 41, a grid electrode 42, and a stage 43 including opposed electrodes. The corona electrode 41 and the grid electrode 42 are connected to a corona electrode power supply 45 and a grid electrode power supply 46, respectively. The corona electrode 41 may have, e.g., a shape of wire. The grid electrode 42 is mesh-processed and configured so that, when a high voltage is applied to the corona electrode 41, ion, electric charge, and so on generated by corona discharge effectively fall onto a sample stage. The stage 43 to set a sample thereon may be connected to a ground wire 44 to facilitate electric charge to flow into a sample (the electromechanical transducer element) being a target of electric discharge. The stage 43 may have a temperature adjustment capability to heat the electromechanical transducer element. In such a case, heating temperatures are not limited to a particular range. However, for example, the stage 43 may be configured to heat the electromechanical transducer element to 350° as a maximum temperature.

The magnitude of the voltage applied to each of the corona electrode 41 and the grid electrode 42 and the distance between the sample and each electrode are not limited in particular. For example, to sufficiently perform polarization processing on the sample, the magnitude of the voltage applied to each of the corona electrode 41 and the grid electrode 42 and the distance between the sample and each electrode may be adjusted in accordance with the sample to adjust the intensity of the corona discharge.

Figure 5:
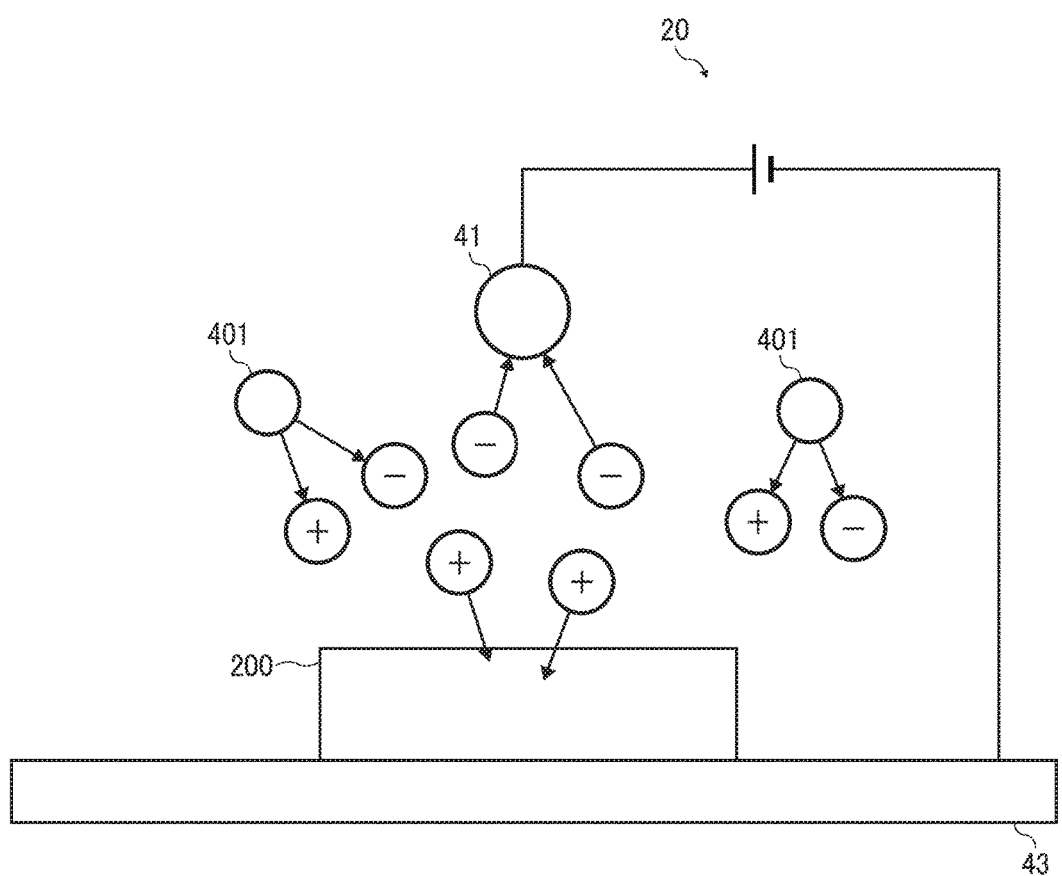
FIG. 5 is an illustration of polarization processing by the polarization processing device illustrated in FIG. 4.

FIG. 5 is an illustration of polarization processing by the polarization processing device illustrated in FIG. 4. is illustrated in FIG. 5, if corona discharge is generated with the corona electrode 41 (e.g., corona wire), polarization processing ionizes atmospheric molecules 401, thus generating positive ions. The positive ions generated flow into an electromechanical transducer film through, for example, a common electrode pad and a discrete electrode pad of the electromechanical transducer element 200, thus causing a stage in which electric charge is accumulated in the electromechanical transducer element 200. Accordingly, an internal potential difference is caused by a difference in charge between the upper electrode and the lower electrode, thus causing polarization processing to be performed.

The amount of charge required for the above-described polarization processing is not limited to any particular amount. However, for example, an amount of charge not less than $1.0 \times 10^{-8}$ [C] may be accumulated in the electromechanical transducer element 200. Alternatively, for example, an amount of charge not less than $4.0 \times 10^{-8}$ [C] may be accumulated in the electromechanical transducer element 200. Accumulating an amount of charge in such a range in the electromechanical transducer element 200 allows polarization processing to be performed to more reliably obtain a polarization rate as described later. The amount of charge accumulated is not less than $1.0 \times 10^{-8}$ [C], so that a sufficiently property is obtained as for the deterioration of displacement after continuous driving of the electromechanical transducer element.

Figure 6A:
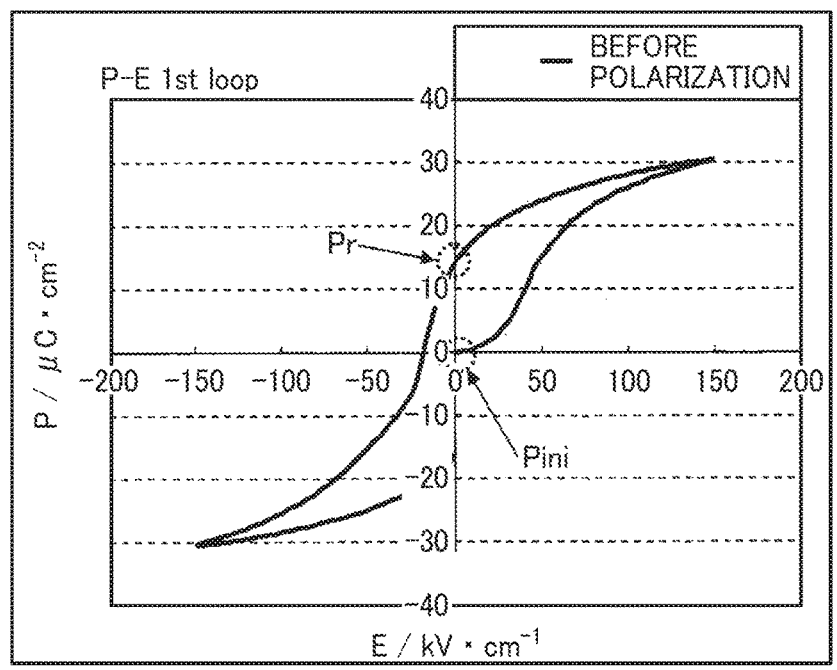
FIG. 6A is a characteristic diagram of an example of a P-E hysteresis loop of the electromechanical transducer element before polarization processing.
Figure 6B:
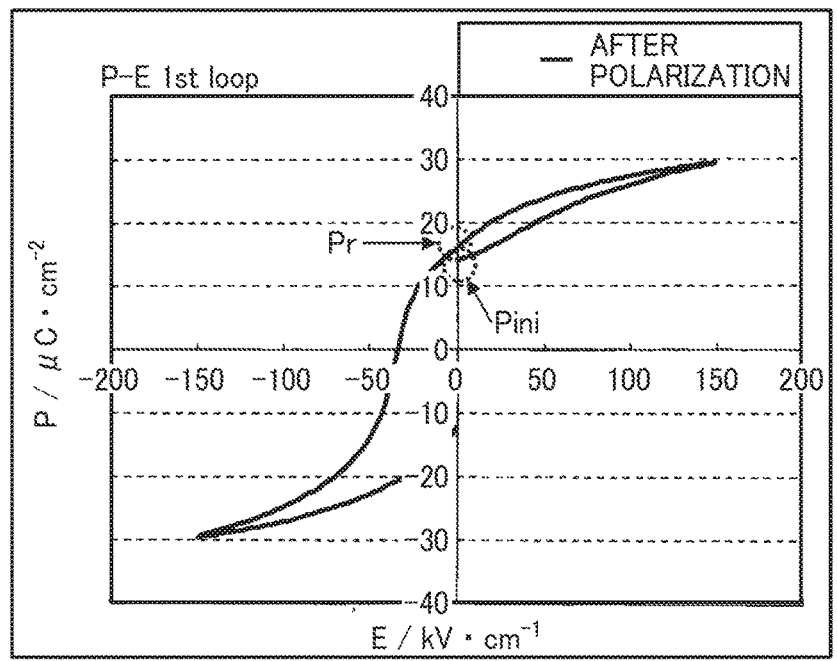
FIG. 6B is a characteristic diagram of an example of a P-E hysteresis loop of the electromechanical transducer element after polarization processing.

The state of polarization processing of the electromechanical transducer element 200 can be determined from a P-E hysteresis loop of the electromechanical transducer element 200. FIG. 6A is a characteristic diagram of an example of a P-E hysteresis loop of the electromechanical transducer element before polarization processing. FIG. 6B is a characteristic diagram of an example of a P-E hysteresis loop of the electromechanical transducer element after polarization processing.

As illustrated in FIGS. 6A and 6B, when hysteresis loop is measured with an intensity of electric field of ±150 kV/cm applied to the electromechanical transducer element 200 by application of voltage, Pini represents a polarization at 0 kV/cm before application of voltage to the electromechanical transducer element 200. Pr represents a polarization at 0 kV/cm when the intensity of electric field is returned to 0 kV/cm after a voltage of +150 kV/cm is applied to the electromechanical transducer element 200. Here, the value of Pr-Pini is defined as "polarization rate". Based on the polarization rate, it can be determined whether the state of polarization is proper. For example, as illustrated in FIG. 6B, when the value of polarization rate of Pr-Pini measured in the electromechanical transducer element 200 after polarization processing is not greater than a predetermined value, it can be determined that the state of polarization is proper. For example, when the value of polarization rate of Pr-Pini is not greater than 10 $\mu C/cm^2$, it can be determined that the state of polarization is proper. Alternatively, when the value of polarization rate of Pr-Pini is not greater than 5 $\mu C/cm^2$, it can be determined that the state of polarization is proper. When the value of Pr-Pini is not sufficiently small, polarization is not sufficiently performed, thus causing a state in which the amount of deformation (the amount of surface displacement) of the electromechanical transducer element 200 relative to a predetermined drive voltage is unstable. In addition, degradation of the amount of deformation (the amount of surface displacement) of the electromechanical transducer element after continuous driving may not be sufficiently suppressed.

Next, a description is given of an example of components of the electromechanical transducer element 200 according to the present embodiment.

As described above, the electromechanical transducer element 200 according to the present embodiment is formed above the substrate 21 with the diaphragm 22 interposed in between. Materials of the substrate 21 are not limited to any particular materials. However, in consideration of ease of processing, availability, and so on, for example, a monocrystalline silicon substrate is preferably used as the substrate 21. There are three types of plane orientation of (100), (110), and (111) for such a monocrystalline silicon substrate. The plane orientation is not limited to any one but a proper substrate is selectable in accordance with the content of processing.

For example, when the substrate 21 is processed by etching, a substrate having a predetermined plane orientation is selectable in accordance with the content of etching. Taking an example of producing a liquid discharge head described later, generally, a substrate is processed by etching to form a pressurizing liquid chamber. In such a case, as a method of etching, typically, anisotropic etching is employed. Anisotropic etching utilizes properties in which the etching rage is different between plane orientations of a crystal structure. For example, in the anisotropic etching in which the substrate is immersed in an alkaline solution, such as KOH, the etching rate of a (111) plane is about $\frac{1}{400}$ of the etching rate of a (100) plane. Therefore, a structure having an inclination of about 54° can be produced in the plane orientation (100). On the other hand, a deep groove can be formed in the plane orientation (110), thus an array density to be increased while rigidity is maintained. Accordingly, for example, for a substrate constituting a liquid discharge head, a monocrystalline silicon substrate having a (110) plane orientation is preferably used. The thickness of the substrate 21 is selectable in accordance with usage and so on and is not limited to any particular range. However, for example, the thickness of the substrate 21 may be 100 μm to 600 μm.

When the diaphragm 22 constitutes the liquid discharge head described later, the diaphragm 22 as a base film receives a force generated by the electromechanical transducer element 200 and deforms (the surface of the diaphragm 22 deforms) to discharge droplets of ink from a pressure chamber. Accordingly, the base film may have a predetermined strength. As the materials of the diaphragm 22, for example, Si, $SiO_2$, and $Si_3N_4$ are prepared according to a chemical vapor deposition (CVD) method. Further, a material may be selected having a linear expansion coefficient close to a linear expansion coefficient of at least one of the lower electrode 23 and the electromechanical transducer film 24 illustrated in FIG. 1. As a material of the electromechanical transducer film 24, in which PZT is typically used, the diaphragm 22 may be made of a material having a linear expansion coefficient of from $5 \times 10^{-6}$ to $10 \times 10^{-6}$ [1/K] close to a linear expansion coefficient of $8 \times 10^{-6}$ [1/K]. Alternatively, for example, the diaphragm 22 may be made of a material having a linear expansion coefficient of from $7 \times 10^{-6}$ to $9 \times 10^{-6}$ [1/K].

Examples of the materials of the diaphragm 22 include aluminum oxide, zirconium oxide, iridium oxide, ruthenium oxide, tantalum oxide, hafnium oxide, osmium oxide, rhenium oxide, rhodium oxide, palladium oxide, and compounds of the foregoing materials. Using such materials, the diaphragm 22 can be produced by a spin coater using a sputtering method or a sol-gel method. The film thickness of the diaphragm 22 may be in a range of not less than 0.1 μm and not greater than 10 μm. Also, the film thickness of the diaphragm 22 may be in a range of not less than 0.5 μm and not greater than 3 μm. The film thickness is such a range, so that the processing on the pressure chamber is easily performed. Also, the film thickness is in such a range, the diaphragm 22 is likely to deform as the base film. Thus, when the diaphragm 22 is used in a liquid discharge apparatus 500, the discharge of droplets (ink droplets) is stable.

A membrane stress of the diaphragm 22 influences membrane property (crystallinity) of the electromechanical transducer film 24 formed on the diaphragm 22. The membrane stress of the diaphragm 22 can be calculated by feinting single-layer films made of material such as Si on the substrate 21 and evaluating an amount of deformation before and after the formation of the single-layer films. It is preferable to design the membrane stress of the diaphragm 22 such that the diaphragm 22 has a convex shape protruding upward when looking the deformation of the substrate 21 just after the lamination of all the single-layer films that form the diaphragm 22 on the substrate 21. Thus, it is preferable to select material of each single-layer films such that the diaphragm 22 as whole has a compressive stress. This is because many materials used for the electromechanical transducer film 24 and the lower electrode 23 have a tension stress. For example, the PZT film has a tensile stress when PZT is used for manufacturing the electromechanical transducer film 24. A platinum (Pt) film has a tensile stress when Pt film is used for manufacturing the lower electrode 23. By forming the diaphragm 22 with the single-layer films having compressive inner stress as a whole, the diaphragm 22 can cancel the tensile stress of the PZT film and the Pt film. Thus, an actuator having a preferable quality can be obtained. Thus, the diaphragm 22 is formed with laminated films that include at least one layer of a single-layer film having a compressive stress. Thus, the diaphragm 22 includes laminated films including both of the single-layer film having a compressive stress and a single-layer film having tensile stress. The diaphragm 22 may include laminated films having only the compressive stress.

The lower electrode 23 and the upper electrode 25 are not limited to any particular materials but any proper materials are selectable. For example, the lower electrode 23 and the upper electrode 25 may be made of a metal film and an oxide electrode film, or in particular, may be made of a lamination of a metal film and an oxide electrode film. As illustrated in FIG. 2, the lower electrode 23 and the upper electrode 25 may include the metal layer 231 and the metal layer 252, respectively, of sufficiently small electrical resistances.

Examples of a metal material of the metal layer 231 and the metal layer 252 include platinum having high heat-resistance and low reactivity. However, platinum may not have a sufficient barrier property against lead. Accordingly, platinum group elements, such as iridium and platinum-rhodium, or alloy films thereof may be used for the metal layer 231 and the metal layer 252. When platinum is used, adhesion of platinum with a base (in particular, $SiO_2$) is poor. Therefore, for example, Ti, $TiO_2$, Ta, $Ta_2O_5$, or $Ta_3N_5$ is preferably laminated in advance as an intervening layer. Examples of a method of producing the metal film include a sputtering method and a vacuum vapor deposition method. The film thickness may be set in a range of from 0.05 μm to 1 μm or a range of from 0.1 μm to 0.5 μm.

As illustrated in FIG. 2, the lower electrode 23 and the upper electrode 25, respectively, may include the oxide electrode layer 232 and the oxide electrode layer 251 each having conductivity at an interface with the electromechanical transducer film 24. Examples of a material of the oxide electrode layer 232 and the oxide electrode layer 251 include SrRuO$_3$ and LaNiO$_3$. The method of film formation of the oxide electrode layer 232 and the oxide electrode layer 251 is not limited to any particular method. For example, the oxide electrode layer 232 and the oxide electrode layer 251 may be formed by a sputtering method.

The oxide electrode layer 232 forming the lower electrode 23 affects the control of orientation of the electromechanical transducer film 24 that is formed on the oxide electrode layer 232. Accordingly, materials to be selected are different in accordance with the preferential orientation. In this embodiment, since the plane orientation of the electromechanical transducer 24 to be preferentially oriented is (100) plane, the electromechanical transducer 24 may be formed after a seed layer made of LaNiO$_3$, TiO$_2$, or PbTiO$_3$ as the oxide electrode layer 232 is formed on the metal layer 231.

An example of a material of the oxide electrode layer 251 forming the upper electrode 25 is SrRuO$_3$ (SRO). The film thickness of the oxide electrode layer 251 may be in a range of from 20 nm to 80 nm or in a range of from 30 nm to 50 nm. The film thickness is in such a range, so that a sufficient characteristic is obtained in the initial amount of deformation (the amount of surface displacement) or the degradation characteristic of the amount of deformation (the amount of surface displacement). Furthermore, the film thickness is in such a range, so that a dielectric strength voltage of the subsequently formed piezoelectric film 24 is obtained and leakage is restrained.

An example of a material of the electromechanical transducer film 24 is an oxide including Pb (for example, PZT). The PZT is a solid solution of lead zirconate (PbZrO$_3$) and lead titanium (PbTiO$_3$) and has a property difference according to a ratio of the lead zirconate (PbZrO$_3$) and the lead titanium (PbTiO$_3$). In a composition present a generally superior piezoelectric property, a ratio of PbZrO$_3$ and PbTiO$_3$ is 53:47. If the composition is represented by a chemical formula, the composition is represented by Pb(Zr$_{0.53}$Ti$_{0.47}$)O$_3$, generally, PZT (53/47).

Another example of a material of the electromechanical transducer film 24 is barium titanate as a composite oxide other than the PZT. In such a case, barium alkoxide and titanium alkoxide compounds are used as a starting material and are dissolved in a common solvent, to prepare a barium titanate precursor solution.

In this embodiment, an example is described in which the electromechanical transducer film 24 is made of PZT and the (100) plane of PZT is preferentially oriented. In such a case, the composition ratio of Zr and Ti, that is, Ti/(Zr+Ti) may be set not less than 0.40 (40%) and not greater than 0.55 (55%), or preferably not less than 0.45 (45%) and not greater than 0.53 (53%).

The method of producing the electromechanical transducer film 24 is not limited to any particular method. For example, the piezoelectric film 24 may be produced by a spin coater using, for example, a sputtering method or a sol-gel method. In any case, patterning is necessary and is performed by, for example, photolithoetching to obtain a desired pattern.

When the sol-gel method is used, the electromechanical transducer film 24 is produced according to, for example, the following procedure. For example, lead acetate, zirconium alkoxide, and titanium alkoxide compound are used as starting materials and are dissolved in methoxyethanol as a common solvent to obtain a uniform solution. Thus, a PZT precursor solution can be prepared. Since a metal alkoxide compound is easily hydrolyzed by atmospheric water, a stabilizer, such as acetylacetone, acetic acid, or diethanolamine may be appropriately added to the PZT precursor solution.

When the electromechanical transducer film 24 is formed on an entire surface of the base substrate in which the lower electrode is formed, the electromechanical transducer film 24 is obtained by forming a coating by a solution coating method, such as a spin coating method, and performing each heat treatment of solvent drying, thermal decomposition, and crystallization on the coating. When the coated film is transformed to the crystallized film, the volume of the film contracts. Thus, to obtain a crack-free film, the precursor density is preferably adjusted to obtain a film thickness not greater than 100 nm in one-time process.

Alternatively, in the production according to an inkjet method, a patterned film can be obtained by a production flow similar to a production flow of the oxide electrode layer 232. A surface modifier is selected in accordance with a material of the metal layer 231 as a base of the surface modifier. When an oxide is used as the base of the surface modifier, mainly a silane compound is selected as the surface modifier. When a metal is used as the base, mainly alkanethiol is selected.

The film thickness of the electromechanical transducer film 24 is not limited to a particular thickness but is selectable in accordance with the amount of deformation (the amount of surface displacement). For example, the film thickness may be in a range of from 0.5 μm to 5 μm or in a range of from 1 μm to 2 μm. A film thickness in such a range generates a sufficient amount of deformation (the amount of surface displacement). With a film thickness in such a range, the number of steps for laminating layers to form the electromechanical transducer film 24 does not unnecessarily increase, thus allows production with good productivity.

The first insulating protective film 31, the second insulating protective film 38, the connector 35, and the inter-pad connector 37 are produced, for example, as follows.

The first insulating protective film 31 may be made of a material that is impermeable to moisture in the atmosphere and prevents damage to the electromechanical transducer element 200 in the steps of film formation and etching. Accordingly, for example, dense inorganic material (inorganic compound) may be used. As the first insulating protective film 31, an oxide, nitride, or carbonized film may be used to obtain a high degree of protection performance with a thin film. The first insulating protective film 31 may be made of a material highly adhesive to a material of a base (a material of the upper electrode 25, the lower electrode 23, and the electromechanical transducer film 24, or a material of an upper surface of the substrate 21) contacting the first insulating protective film 31. Examples of such a material include an oxide film used for ceramic materials, such as Al$_2$O$_3$, ZrO$_2$, Y$_2$O$_3$, Ta$_2$O$_3$, and TiO$_2$ are exemplified.

The method of film formation of the first insulating protective film 31 is not limited to any particular method. For example, a method of film formation that does not damage the electromechanical transducer element 200 is selected as the method. For example, a vapor deposition method or an atomic layer deposition (ALD) method may be used. In particular, film formation may be performed according to the ALD method that is advantageous in that the number of selectable materials is greater. In particular, according to the ALD method, a thin film with quite high film density is produced, thus reducing damage to the electromechanical transducer element 200 in the production steps.

The film thickness of the first insulating protective film 31 is not limited to any particular thickness. However, the first insulating protective film 31 has a thickness sufficient to obtain a protection performance of the electromechanical transducer element 200 and is small enough not to hamper the displacement of the electromechanical transducer element 200. For example, the film thickness of the first insulating protective film 31 may be not less than 20 nm and not greater than 100 nm. The film thickness is in such a range, so that the displacement of the electromechanical transducer element 200 is not hampered. Furthermore, the range provides sufficient protection of the electromechanical transducer element 200.

The first insulating protective film 31 may be formed of a plurality of layers. For example, when the first insulating protective film 31 is formed of two layers, to construct the second layer of the first insulating protective film 31 relatively thicker, an opening may be formed near the upper electrode in the second layer of the first insulating protective film 31 so as not to significantly hamper the vibration displacement of the electromechanical transducer element 200. As the second layer of the first insulating protective film 31, any oxide, nitride, and carbide or a composite compound thereof can be used. For example, $SiO_2$, which is typically used in a semiconductor device, may be used.

The film formation may be any suitable method. For example, the CVD method or sputtering method may be used for film formation. In particular, if the step coating of a pattern forming part, such as an electrode forming part, is considered, the CVD method capable of isotropically forming a film may be used. The film thickness of the second layer of the first insulating protective film 31 is not limited to any particular film thickness. In consideration of the voltage applied to each electrode, a film thickness not dielectrically broken down is selectable. For example, the intensity of electric field applied to the first insulating protective film 31 is set in a range in which the insulating protective film is not dielectrically broken down. In consideration of the surface properties or pin holes of the base of the first insulating protective film 31, the film thickness may be not less than 200 nm or may be not less than 500 nm.

Materials of the connector 35 and the inter-pad connector 37 are not limited to any particular materials but various types of conductive materials are usable. For example, each of the connector 35 and the inter-pad connector 37 may be made of any metal electrode material selected from Cu, Al, Au, Pt, Ir, Ag alloy, and Al alloy.

The method of producing the connector 35 and the inter-pad connector 37 is not limited to any particular method but any particular method can be used. The connector 35 and the inter-pad connector 37 are produced by, for example, the sputtering method or the spin coating method and a desired pattern is obtained by, for example, photolithographic etching.

The film thickness of each of the connector 35 and the inter-pad connector 37 is not limited to any particular thickness but may be, for example, not less than 0.1 µm and not greater than 20 µm or not less than 0.2 µm and not greater than 10 µm. The film thickness is in such a range, so that a sufficient current is flowed to the electrode. Furthermore, the range provides a shorter time in the production process.

When the first insulating protective film 31 is provided, a contact-hole portion for the connector 35 and the inter-pad connector 37 is disposed in the first insulating protective film 31 so that the connector 35 and the inter-pad connector 37 can be connected to the common electrode and the discrete electrode at the contact-hole portion. The dimension of the contact-hole portion is not limited to any particular size but may be, for example, 10 µm×10 µm. As the contact resistance of the contact-hole portion, the common electrode may have a contact resistance of, for example, not greater than 10Ω and the discrete electrode may have a contact resistance of, for example, not greater than 1Ω. Such a range allows stable supply of a sufficient current to each electrode. Alternatively, the common electrode may have a contact resistance of not greater than 5Ω and the discrete electrode may have a contact resistance of not greater than 0.5Ω. With a contact resistance in, such, a range, when the electromechanical transducer 200 is used in the liquid discharge head 104 (see FIG. 19), a sufficient electric current is supplied to the electrode. The second insulating protective film 38 is a passivation layer having a function of protecting the connector 35 and the inter-pad connector 37. The second insulating protective film 38 covers the connector 35 and the inter-pad connector 37, except for areas of the discrete electrode pad 34 and the common electrode pad 36. Even when low cost Al or an alloy material including Al as main ingredient is used for the connector 35 and the inter-pad connector 37, such a configuration enhances the reliability of the electromechanical transducer element 200. In addition, since low cost materials are used for the connector 35 and the inter-pad connector 37, the cost of the electromechanical transducer element 200 is reduced.

The material of the second insulating protective film 38 is not limited to any particular material but any inorganic material or any organic material can be used. For example, a material with low moisture permeability may be used. Examples of inorganic material include oxide, nitride, and carbide. Examples of organic material include polyimide, acrylic resin, and urethane resin. However, for organic material, to function as the insulating protective film, the film thickness may be relatively thick and patterning may not be easily performed. Accordingly, an inorganic material may be used that has a function of protecting wiring in a thin film. When Al wiring is used as the connector 35 and the inter-pad connector 37, for example, $Si_3N_4$, which is widely used in semiconductor devices, may be used as the second insulating protective film 38.

The film thickness of the second insulating protective film 38 may be, for example, not less than 200 nm or not less than 500 nm. The film thickness is in such a range, so that a sufficient passivation performance is obtained. For example, breaking due to corrosion of the connector is restrained.

The second insulating protective film 38 may have openings above the electromechanical transducer elements 200. When the electromechanical transducer element 200 is applied to the liquid discharge head 104, the second insulating protective film 38 may have openings above the diaphragm 22. Such a configuration allows the electromechanical transducer element 200 to be more efficient and more reliable. The second insulating protective film 38 may have openings to expose the common electrode pad 36 and the discrete electrode pad 34. The openings are formed by, for example, a photolithography method and dry etching.

The area of each of the common electrode pad 36 and the discrete electrode pad 34 is not limited to any particular size. When polarization processing is performed after formation of the common electrode pad 36, the discrete electrode pad 34, and the second insulating protective film 38, electric charge is supplied from each of the common electrode pad 36 and the discrete electrode pad 34. Therefore, for example, the area of each of the common electrode pad 36 and the discrete electrode pad 34 may be set to such a size that polarization processing is fully performed. For example, each of the common electrode pad 36 and the discrete electrode pad 34 may have not less than a size of 50 μm×50 μm or may have not less than a size of 100 μm×300 μm. The area of the common electrode pad 36 and the discrete electrode pad 34 is in above-described range, the polarization processing is sufficiently performed and the degree of degradation of the amount of deformation (the amount of surface displacement) reduces over time after continuous driving.

Next, a description is given of a relationship between crystal orientation of the electromechanical transducer film 24 and properties as the electromechanical transducer element 200 in this embodiment.

In the present disclosure, the "orientation rate" of a particular crystal plane oriented perpendicular to the thickness direction of the electromechanical transducer film 24 is defined by the following measurement. First, θ-2θ scanning measurement using an X-ray diffraction (XRD) method is performed on the electromechanical transducer film 24. Then, the area of a peak corresponding to the particular crystal plane observed on a 2θ spectrum curve and the area of each of all peaks or main peaks observed on the 2θ spectrum curve are determined. The "orientation rate" of the particular crystal plane is represented by a percentage of a value obtained by dividing the area of the peak corresponding to the particular crystal plane by a sum of the areas of all peaks or main peaks.

In the present disclosure, the degree of orientation $\rho_{(hk1)}$ of the (hk1) plane of the electromechanical transducer film 24 is defined by the formula of $\rho_{(hk1)} = I_{(hk1)} / \Sigma I_{(hk1)}$. Here, $I_{(hk1)}$ is a peak intensity of a diffraction peak derived from a given (hk1) plane obtained by the θ-2θ scanning measurement using the X-ray diffraction (XRD) method on the electromechanical transducer film 24. $\Sigma I_{(hk1)}$ is a total sum of peak intensities of a plurality of diffraction peaks obtained by the θ-2θ scanning measurement using the X-ray diffraction (XRD) method on the electromechanical transducer film 24.

Figure 7:
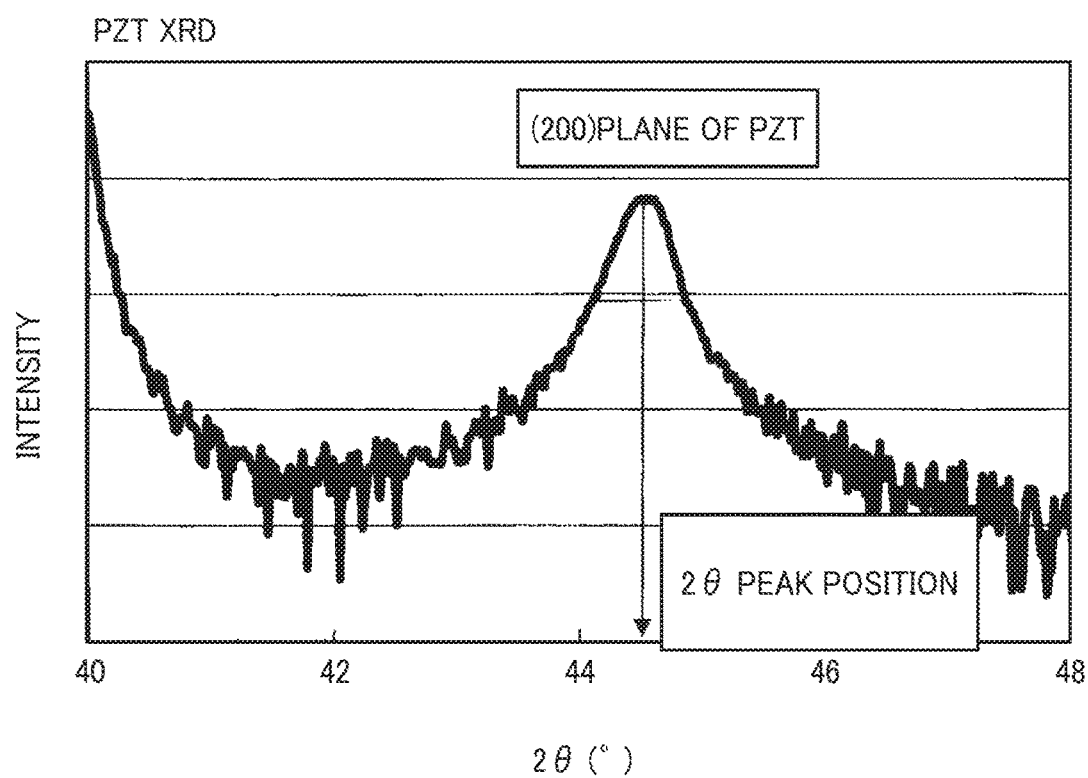
FIG. 7 is a graph of an example diffraction peak profile derived from a (200) plane of an electromechanical transducer film obtained by a θ-2θ scanning measurement using an X-ray diffraction (XRD) method.

FIG. 7 is a graph of an example diffraction peak profile derived from a (200) plane of the electromechanical transducer film obtained by the θ-2θ scanning measurement using the X-ray diffraction (XRD) method. In FIG. 7, the horizontal axis represents the value of 2θ in the θ-2θ scanning measurement using the X-ray diffraction (XRD) method. The vertical axis represents the diffraction intensity measured at each 2θ. Through experiments and investigations, the present inventors have found that, as the composition ratio of Zr/Ti in PZT changes, as illustrated in FIG. 7, the 2θ peak position (diffraction peak position) corresponding to the (200) plane of the electromechanical transducer film 24 (hereinafter, referred to as "PZT (200) plane") and the peak asymmetry also change. From the results, by adjusting various parameters in the production process so that the 2θ peak position and the peak asymmetry of the PZT (200) plane at a high angle side are optimal the amount of deformation (the amount of surface displacement) is obtained that preferably maintains droplet discharge properties when the electromechanical transducer film 24 is used for the liquid discharge head 104.

The diffraction peak position (2θ) of the PZT (200) plane may be not less than 44.50° and not greater than 44.80° or may be not less than 44.65° and not greater than 44.75° in a state in which the electromechanical transducer film 24 is constrained by the substrate 21 as a base. When the liquid discharge head 104 is formed (see FIG. 19) in a state, in which liquid chambers, such as the pressure chambers 80, are formed, the piezoelectric film 24 is not constrained by the substrate 21. In such a case, since the crystal lattice extends in a vertical direction to a plane of the substrate 21, the diffraction peak position (2θ) of the PZT (200) plane is smaller. The diffraction peak position (2θ) of the PZT (200) plane may be not less than 44.45° and not greater than 44.75°, or may be not less than 44.55° and not greater than 44.70° in a state in which the electromechanical transducer film 24 is not constrained by the substrate 21.

The composition ratio of Zr/Ti in PZT is in the above-described predetermined range or the 2θ position (diffraction peak position) of the PZT (200) plane is in the above-described predetermined range, so that the amount of deformation (the amount of surface displacement) accompanying a rotational strain and a piezoelectric strain described later is obtained. Accordingly, the amount of deformation (the amount of surface displacement) of the electromechanical transducer element 200 is sufficiently obtained.

Figure 8:
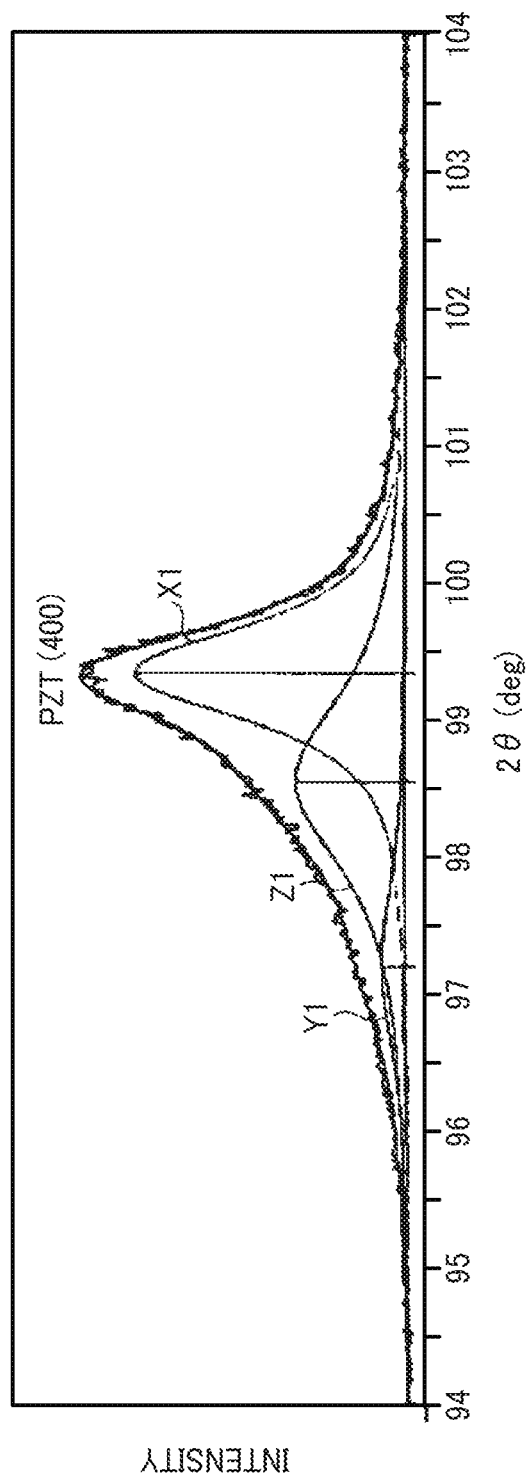
FIG. 8 is a graph of an example result of separating a diffraction peak into constituent component peaks, focusing on a diffraction peak derived from a (400) plane of the electromechanical transducer film.

FIG. 8 is a graph of an example result of separating a diffraction peak into constituent component peaks, focusing on diffraction peak derived from a (400) plane of the electromechanical transducer film. In FIG. 8, the horizontal axis represents the value of 2θ in the θ-2θ scanning measurement using the X-ray diffraction (XRD) method. The vertical axis represents the diffraction intensity measured at each 2θ.

Focusing on a diffraction peak derived from the (400) plane, a peak separation is performed on the electromechanical transducer film 24 having a 2θ position (diffraction peak position) adjusted within the above-described predetermined range by the above-described composition ratio of Zr/Ti, to identify the attribution state of the crystal structure.

In a case where the asymmetry property of the diffraction peak is great as illustrated in FIG. 8, the diffraction peak attributes to three crystal structures. Specifically, the diffraction peak is separated to a first diffraction peak (i.e., first constituent component peak) attributed to a tetragonal a-domain structure X1, a second diffraction peak (i.e., second constituent component peak) attributed to a mixed structure Z1 of any one of a rhombohedral structure, an orthorhombic structure, and a pseudo-cubic structure and a third diffraction peak (i.e., third constituent component peak) attributed to a tetragonal c-domain structure Y1.

Here, the term "a-domain" represents a domain in which an a-axis of the perovskite crystal (PZT crystal) is parallel to a film thickness direction of the electromechanical transducer film 24 among a plurality of types of domains included in a perovskite crystal (PZT crystal) of the electromechanical transducer film 24. Here, the term "c-domain" represents a domain in which a c-axis (spontaneous polarization axis) of the perovskite crystal (PZT crystal) is parallel to the film thickness direction. The term "a-domain structure X1" represents the crystal structure of a-domain. The term "c-domain structure Y1" represents the crystal structure of c-domain.

Sa represents a diffraction peak area of the first diffraction peak attributable to the tetragonal a-domain structure X1. Sb represents a diffraction peak area of the second diffraction peak attributable to the mixed structure Z1. Sc represents a diffraction peak area of the third diffraction peak attributable to the tetragonal c-domain structure Y1. The ratio of the diffraction peak area Sb to the sum of the diffraction peak area Sa, the diffraction peak area Sb and the diffraction peak area Sc, can be represented by S1=Sb/(Sa+Sb+Sc). S1 is called a mixed structure ratio. When the mixed structure ratio S1 is not less than 0.01 (1%) and not greater than 0.60

(60%), or preferably not less than 0.15 (15%) and not greater than 0.40 (40%), the amount of deformation (the amount of surface displacement) accompanied with the rotation strain of the electromechanical transducer film 24 becomes larger. Thus, the electromechanical transducer element 200 obtains sufficient amounts of deformation.

By this range of the mixed structure ratio S1, it is thought that a strain characteristic is well-balanced due to the piezoelectric strain of the tetragonal a-domain structure X1 and the tetragonal c-domain structure Y1, and the rotation strain, so that the piezoelectric characteristic is higher.

Next, the rotation strain is described below. When an electric field along the a-axis is applied to the tetragonal c-domain structure, a polarization direction of the c-domain changes to the a-axis direction, and the domain direction of the c-domain rotates by 90° in a 90° domain wall having a boundary where the a-domain structure and the c-domain structure are separated by a domain wall. This phenomenon is called a 90° domain rotation. By the 90° domain rotation, a domain wall which is a boundary between the a-domain structure and the c-domain structure moves. The 90° domain rotation from the c-axis direction to the a-axis direction does not occur except for the 90° domain wall structure where the c-domain structure is in contact with the a-domain structure. That is, in a region where c-domain structures are in contact with each other, even if an electric field is applied along the a-axis direction, the 90° domain rotation does not occur. This is because, in a case of applying an electric field, at first a piezoelectric strain occurs in the a-domain structure by a piezoelectric effect, and the piezoelectric strain is transferred to the adjacent c-domain structure via the 90° domain wall, and thereby the polarization direction of the c-domain structure rotates to the electric field applied direction. Compared with the piezoelectric strain by the piezoelectric effect, the rotation strain by such as the 90° domain rotation causes large deformation of the electromechanical transducer film 24. That is, if it is possible to cause the rotation strain to occur effectively, the amount of deformation of the electromechanical transducer element 200 can be improved.

In a case where the asymmetry property of the diffraction peak is great as illustrated in FIG. 8, the amount of deformation of the electromechanical transducer element 200 is improved. This is because the rotation strain effectively occurs by including different crystal structures such as the tetragonal structure, the rhombohedral structure and so on. As illustrated in FIG. 8, when a peak separation is performed on the diffraction peak derived from the (400) plane, the diffraction peak derived from the (400) plane is separated to three diffraction peaks (i.e., constituent component peaks). Three diffraction peaks are a first diffraction peak attributable to a tetragonal a-domain structure X1, a second diffraction peak attributable to a mixed structure Z1 of any one of a rhombohedral structure, an orthorhombic structure, and a pseudo-cubic structure and a third diffraction peak attributable to a tetragonal c-domain structure Y1.

Next, the method of separating peaks is described. First, after estimating a crystal structure to be attributed, fitting is performed centering on a 2θ position written in a Joint Committee on Powder Diffraction Standards (JCPDS) card. For example, when performing the fitting with one separated diffraction peak, the peak position of the separated diffraction peak is fitted to the 2θ position where the peak intensity is the maximum in a measured value. As the number of separated diffraction peaks to be fitted increases (i.e., as the number of fittings increases), a fitting residue becomes smaller. The number of fittings is determined where a change in the fitting residue becomes stable.

Figure 9:
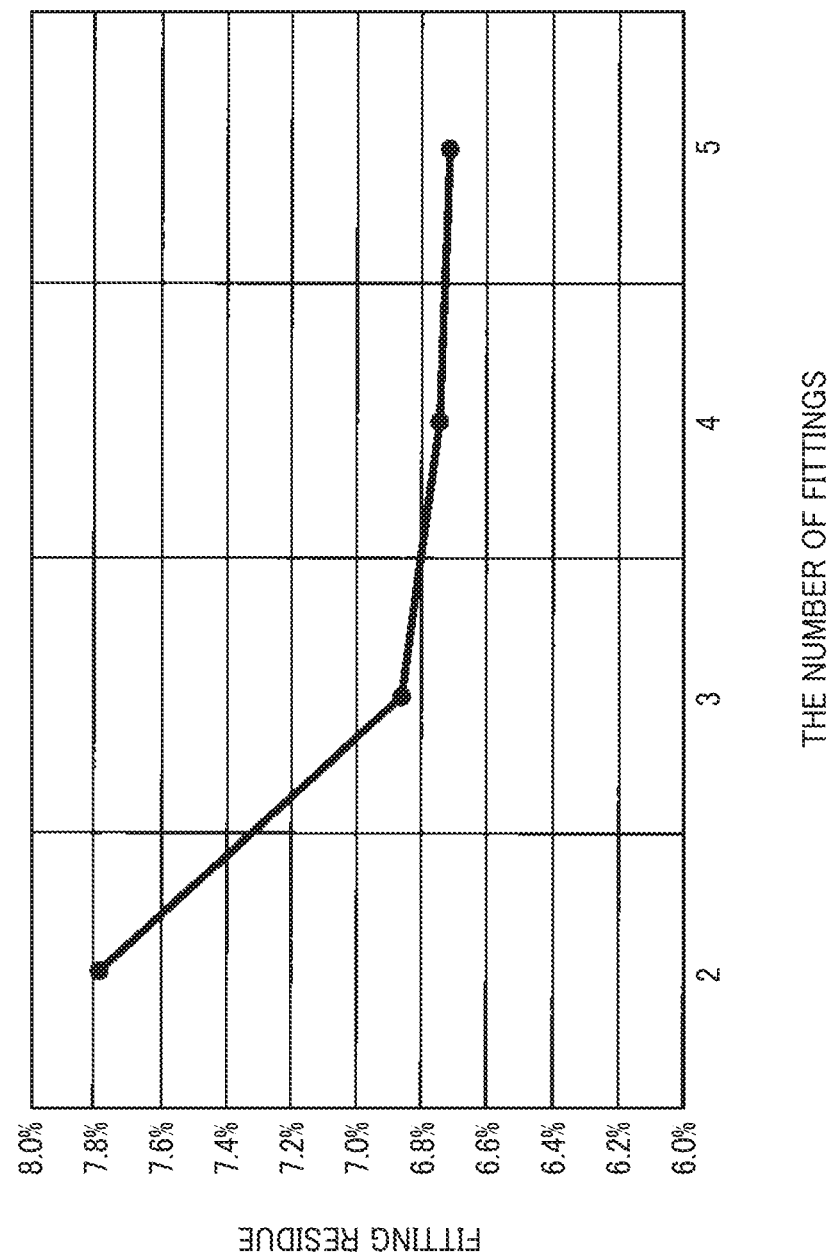
FIG. 9 is a graph for explaining a method of peak separation, illustrating a fitting residue as a function of the number of fittings performed.

In this embodiment, for example, until the fitting residue becomes 10% or less, the number of the separated diffraction peaks to be fitted (i.e., the number of fittings) are increased. And, the number at which the change in the fitting residue becomes stable is determined as the number of separated diffraction peak. In this embodiment, because the fitting residue is stable where the number of fittings is three as illustrated in FIG. 9, the number of separated diffraction peaks is set to three.

When the peak separation (i.e., fitting) is performed, a certain variation occurs. Thus, an average value is obtained when repeated fitting is performed. The average value is calculated by excluding extremely deviated fittings. For example, the number of repeating fitting is about 6 to 10 times.

Figure 10:
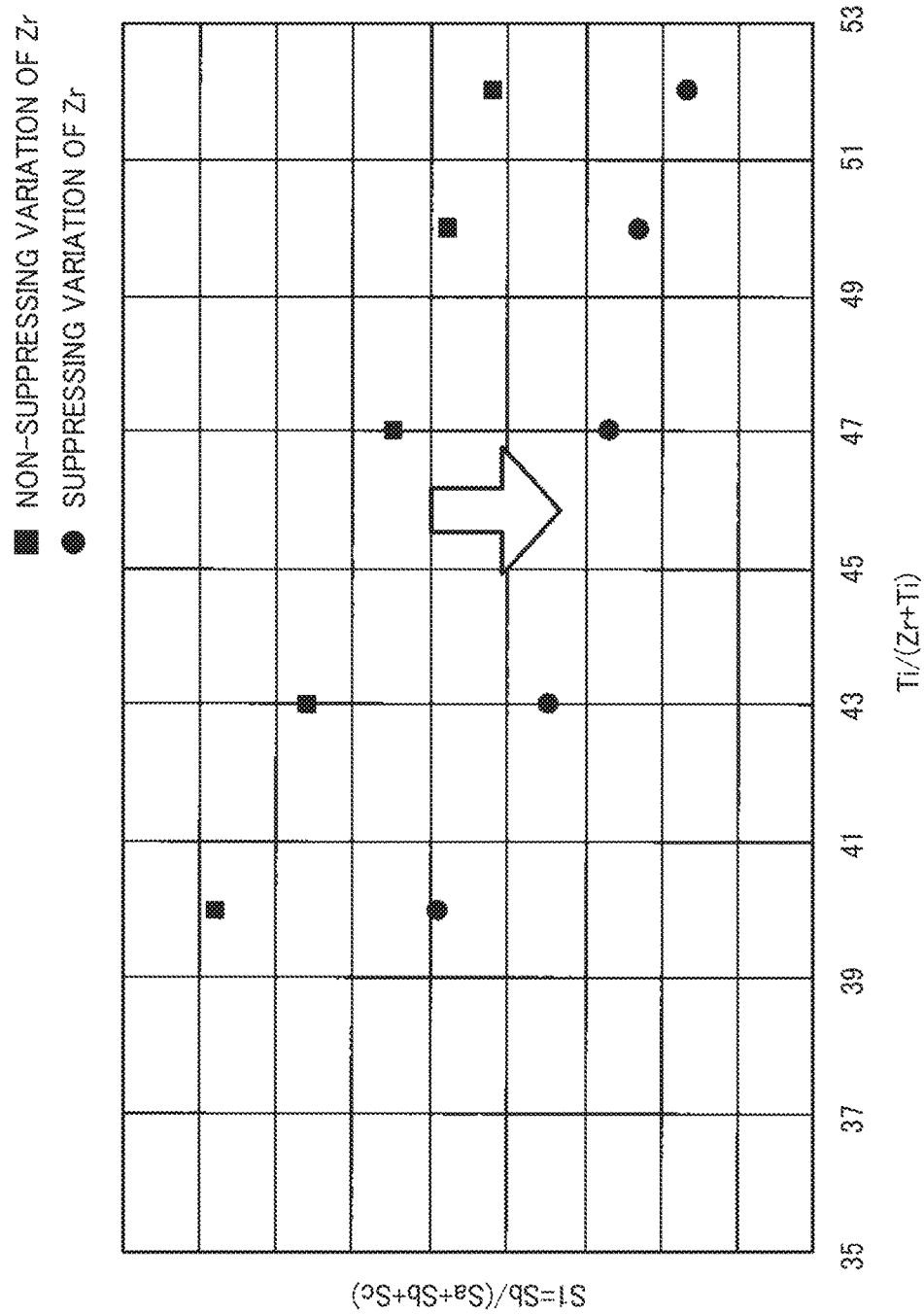
FIG. 10 is a graph illustrating an example of a relation between a composition ratio of Zr and Ti, that is Ti/(Zr+Ti), and a mixed structure ratio, that is S1=Sb/(Sa+Sb+Sc)

FIG. 10 is a graph illustrating an example of a relation between a composition ratio of zirconium (Zr) and titanium (Ti), that is Ti/(Zr+Ti) representing Ti to a sum of Zr and Ti, and the mixed structure ratio, that is S1=Sb/(Sa+Sb+Sc). As illustrated in FIG. 10, when Ti/(Zr+Ti) is varied within the range where the diffraction peak of (200) plane or (400) plane exhibits asymmetry, there is a tendency that the mixed structure ratio S1 decreases as the Ti/(Zr+Ti) increases.

Also, two examples are shown in the graph of FIG. 10, such as one example in which the variation of Zr in a film thickness is suppressed, another example in which the variation of Zr in a film thickness is not suppressed. Compared with the example in which Zr variation in the film thickness direction is not suppressed, the mixed structure ratio S1 is further lowered while maintaining the asymmetry in the example in which Zr variation in the film thickness direction is suppressed.

Figure 11:
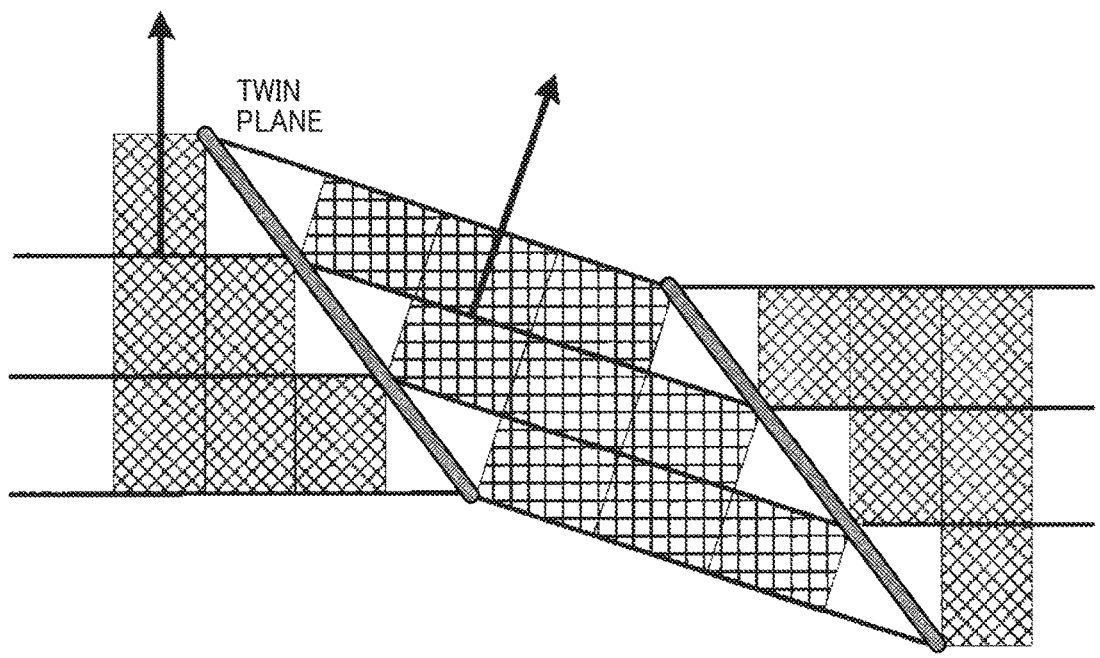
FIG. 11 is an illustration of a twin plane as a connecter of a c-domain structure Y1 and an a-domain structure X1.

The mixed structure Z1 does not cause the piezoelectric strain that itself expands and contracts itself, and does not cause the rotation strain that itself rotates. The function of the mixed structure Z1 is thought to be close to a twin plane illustrated in FIG. 11 which is a tethering between the tetragonal a-domain structure X1 and the tetragonal c-domain structure Y1 having different lattice constants each other. In this way, since the electromechanical transducer film 24 includes a predetermined ratio of the mixed structure Z1, it is thought that a strain characteristic is well-balanced due to both the piezoelectric strain and the rotation strain, so that the piezoelectric characteristic is higher.

Figure 12:
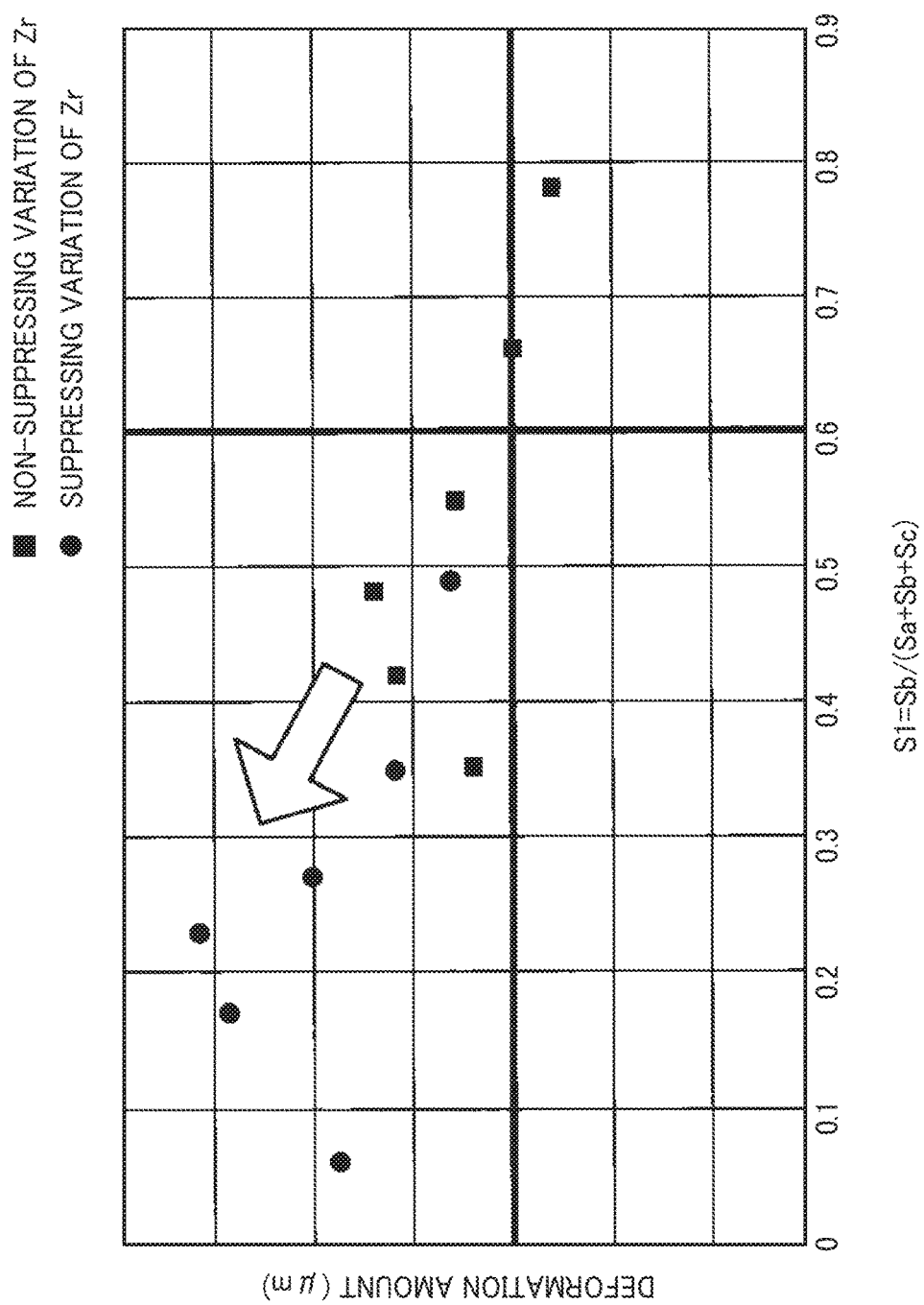
FIG. 12 is a graph illustrating an example of a relation between the mixed structure ratio as Sb/(Sa+Sb+Sc) and a deformation amount of the electromechanical transducer film.

FIG. 12 is a graph illustrating an example of a relation between the mixed structure ratio as S1=Sb/(Sa+Sb+Sc) and a deformation amount of the electromechanical transducer film. As illustrated in FIG. 12, as the mixed structure ratio S1 is smaller, the deformation of the electromechanical transducer film is larger. Also, as illustrated in FIG. 10, since the variation of Zr in a film thickness is suppressed, the mixed structure ratio S1 is further smaller, so that the deformation of the electromechanical transduce film is further larger.

Figure 13:
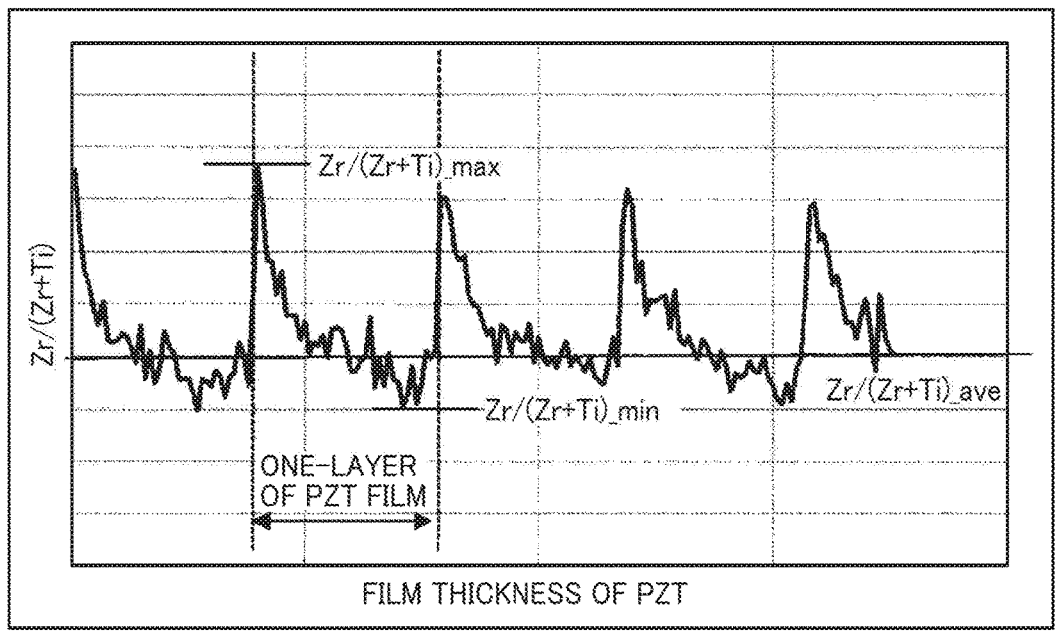
FIG. 13 is a graph illustrating an example of variation of Zr in a film thickness direction of the electromechanical transducer film in a case of non-suppressing variation of Zr.
Figure 14:
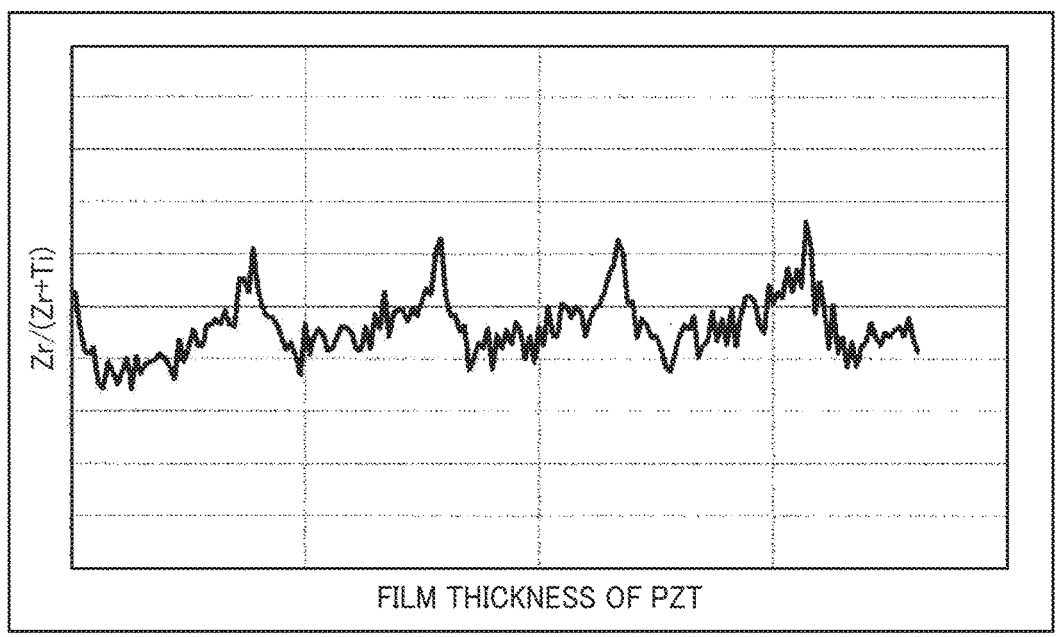
FIG. 14 is a graph illustrating an example of variation of Zr in the film thickness direction of the electromechanical transducer film in a case of suppressing variation of Zr.

FIG. 13 is a graph illustrating an example of variation of Zr in non-suppressing variation of Zr. FIG. 14 is a graph illustrating an example of variation of Zr in suppressing variation of Zr. The graphs in FIGS. 13 and 14 show a composition distribution in the film thickness direction of the electromechanical transducer film measured by a Transmission Electron Microscope-Energy Dispersive Spectroscopy (TEM-EDS). In both graphs, periodical changes of Zr in the film thickness direction have been observed. The electromechanical transducer films in FIG. 13 and FIG. 14 obtain a predetermined film thickness by repeating a precursor film forming step of preparing the PZT precursor film and a baking step of performing crystallization. The PZT film for one layer formed in one baking step is crystallized by the baking a structure in which a plurality of PZT precursor films such as three PZT precursor films are laminated.

In the electromechanical transducer film shown in FIG. 13, the plurality of PZT precursor films forming one layer of the PZT film respectively has a same composition. Due to the difference in crystallization speed between Zr and Ti during the baking step, the ratio of Zr becomes higher toward an upper layer side (i.e., upper electrode side), so that the variation of Zr fluctuates in the film thickness direction of the electromechanical transducer film. As a result, as shown in FIG. 13, in the PZT film for one layer formed in one baking step, the ratio of Zr becomes higher toward the upper layer side. In the electromechanical transducer film in which such a PZT film is laminated, the ratio of Zr varies periodically in the film thickness direction.

On the other hand, in the electromechanical transducer film shown in FIG. 14, the plurality of PZT precursor films forming one layer of the PZT film respectively has a different composition. Specifically, the PZT precursor film on the lower layer side (i.e., lower electrode side) has a higher ratio of Zr. As a result, as shown in FIG. 14, in the PZT film for one layer formed in one baking step, the variation of Zr in the film thickness of the electromechanical transducer film is suppressed.

In illustrated in FIG. 13, Zr/(Zr+Ti)_ave represents an average value of Zr/(Zr+Ti) in the film thickness of the electromechanical transducer film. Zr/(Zr+Ti)_max represents a maximum value of Zr/(Zr+Ti) in one layer of the PZT film. Zr/(Zr+Ti)_min represents a minimum value of Zr/(Zr+Ti) in one layer of the PZT film. $\Delta$Zr1 represents the greater value of two values, (i) and (ii), where value (i) is a value obtained by subtracting Zr/(Zr+Ti)_ave from Zr/(Zr+Ti)_max, that is [Zr/(Zr+Ti)_max−Zr/(Zr+Ti)_ave], and value (ii) is a value obtained by subtracting Zr/(Zr+Ti)_min from Zr/(Zr+Ti)_ave, that is [Zr/(Zr+Ti)_ave−Zr/(Zr+Ti)_min]. $\Delta$Zr2 represents a value obtained by subtracting Zr/(Zr+Ti)_min from Zr/(Zr+Ti)_max, that is [Zr/(Zr+Ti)_max−Zr/(Zr+Ti)_min].

Here, $\Delta$Zr1 is preferably 0.15 (15%) or less, or further preferably 0.07 (7%) or less. $\Delta$Zr2 is preferably 0.25 (25%) or less, or further preferably 0.10 (10%) or less. By this range of $\Delta$Zr1, the ratio of the mixed structure S1=Sb/(Sa+Sb+Sc) can be not less than 1% and not greater than 60%.

Figure 15:
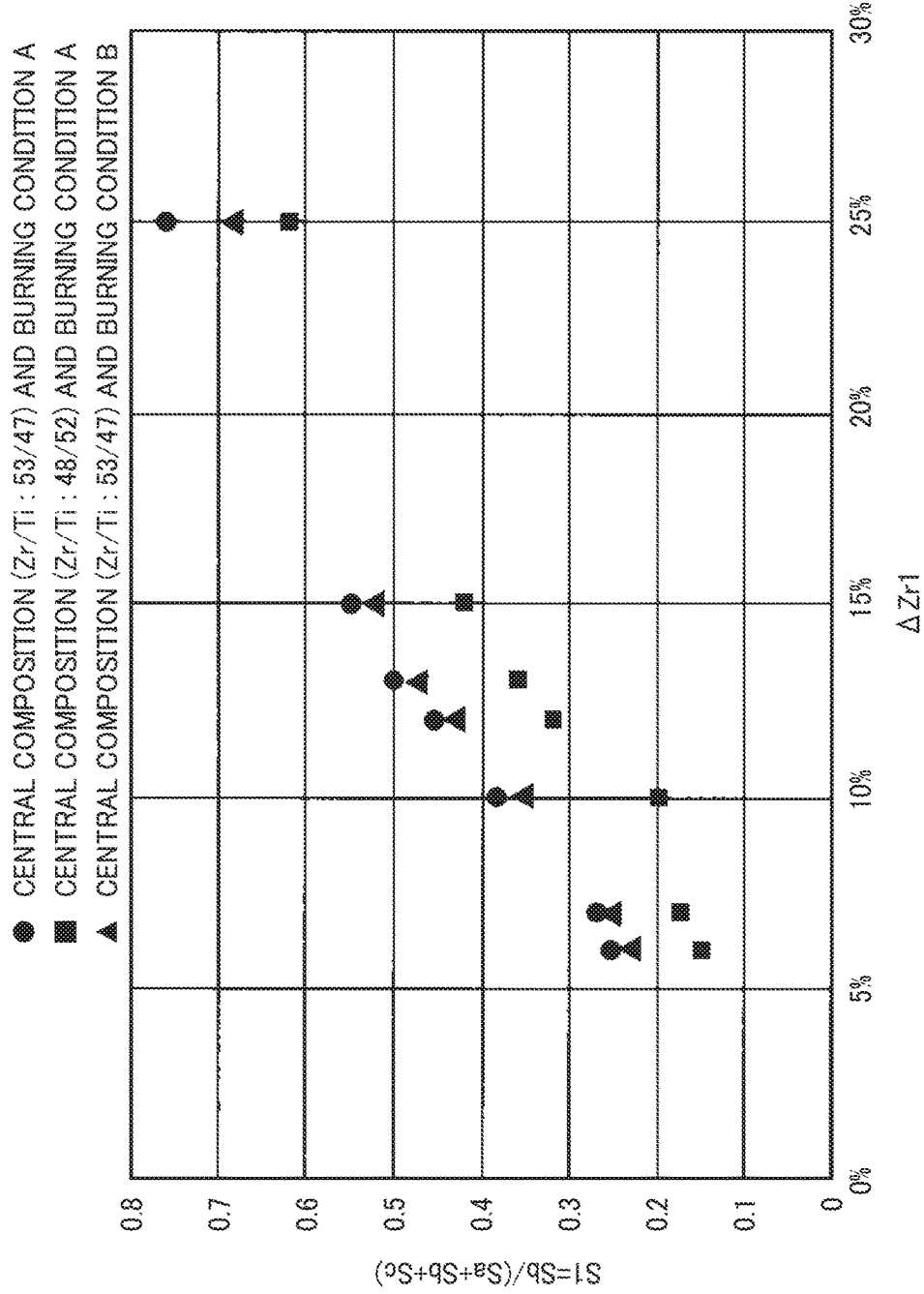
FIG. 15 is a graph illustrating an example of a relation between an amount of Zr variation as ΔZr1 and the mixed structure ratio as Sb/(Sa+Sb+Sc)

FIG. 15 is a graph illustrating an example of a relation between an amount of variation of Zr as $\Delta$Zr1 and the mixed structure ratio as S1=Sb/(Sa+Sb+Sc). In the graph shown in FIG. 15, three examples are shown in which a central composition (an average of Zr/(Zr+Ti) in the film thickness direction) in the electromechanical transducer film and baking conditions (in particular, firing conditions and atmosphere when crystallizing) are changed. There is a slight difference in $\Delta$Zr1 due to a difference of the central composition and baking conditions. However, as $\Delta$Zr1 becomes lower, the mixed structure ratio S1 tends to decrease. $\Delta$Zr1 and $\Delta$Zr2 is in the above described range, so that the mixed structure ratio S1 is 0.6 (60%) or less. As a result, the amount of deformation is sufficiently obtained.

Next, a description is given of a preferential orientation of the electromechanical transducer film 24 according to this embodiment and the degree of orientation (orientation rate) thereof. Here, the term "(100) preferentially oriented" indicates that the (100) plane of an electromechanical transducer film 24 is more preferentially oriented than any other plane. The preferential orientation of the electromechanical transducer film 24 in this embodiment is (100) preferentially oriented.

Figure 16:
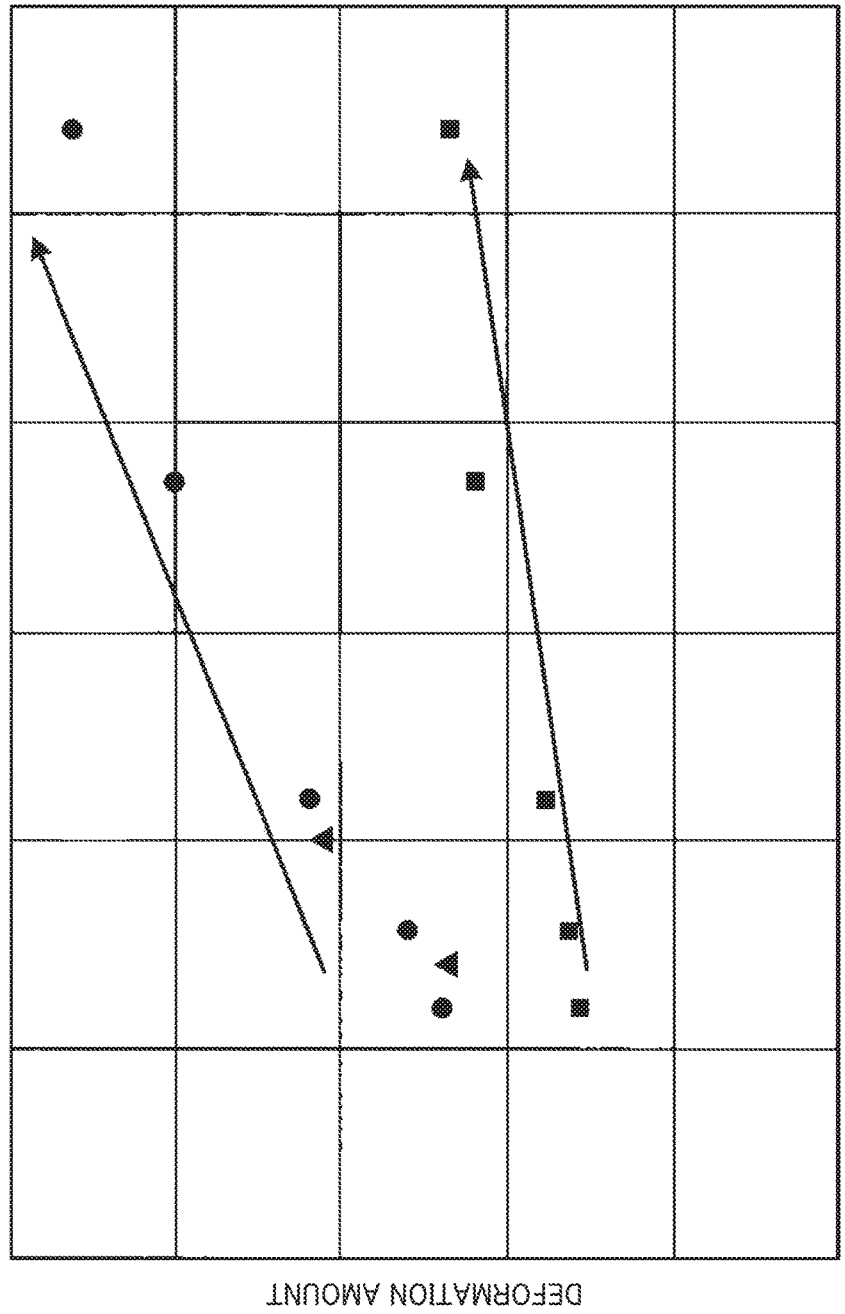
FIG. 16 is a graph illustrating an example of a relation between an orientation rate of a (100) plane and a deformation amount of the electromechanical transducer film.

As illustrated in FIG. 16, the degree of orientation $\rho_{(100)}$ of the (100) plane is preferably not less than 0.95 (95%) or further preferably not less than 0.99 (99%), compared to a range from 70% to 80%.

The above described $\theta$-2$\theta$ method is used to determine how the inter-planar spacing of the crystal at a certain point on the substrate surface is distributed in the thickness direction of the film. It is difficult for the $\theta$-2$\theta$ method to determine how the inter-planar spacing of the crystal at a point minutely moved in the horizontal direction of the substrate surface from the certain point on the substrate surface is distributed in the thickness direction of the film. To make the determination, it is necessary to further perform the measurement according to a rocking curve method. Note that, when the rocking curve method is used, the angle (2$\theta$) between the incidence angle of the X-ray and the detector is fixed in a position where the diffraction intensity by the measurement according to the $\theta$-2$\theta$ method is the maximum, and the diffraction intensity is measured while only the angle ($\omega$) between the incidence angle of the X ray and the sample substrate surface is changed minutely in the vicinity of $\theta$.

The crystal growth direction of a film to be measured is not necessarily vertical to the substrate surface of the film. When the crystal growth direction of the film is not vertical to the substrate surface, the crystal plane is inclined to the substrate surface. In order to determine an amount of the inclination, it is necessary to perform measurement in which a tilt angle ($\chi$) is changed in a position (2$\theta$) where the diffraction intensity obtained by the measurement according to the $\theta$-2$\theta$ method is the maximum. Note that, when a (lmn) plane (where l, m, n=0 or 1) of a crystal included in the electromechanical transducer film is inclined to a surface parallel to the (lmn) plane, the tilt angle ($\chi$) is defined as an angle between the (lmn) plane and the inclined surface.

Figure 17A:
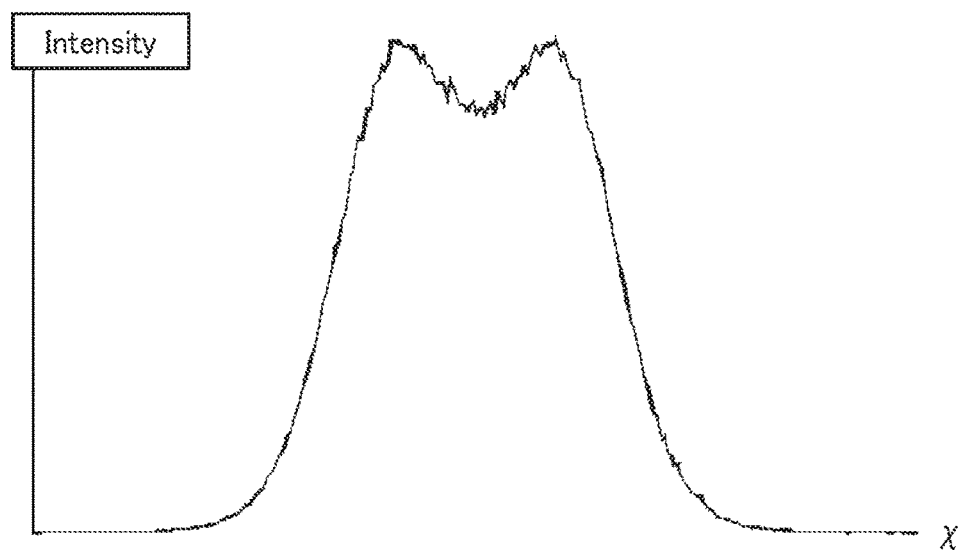
FIG. 17A is a graph illustrating an example of a diffraction intensity peak profile of a (100) preferentially oriented electromechanical transducer film obtained by measurement in which a tilt angle (χ) is changed.
Figure 17B:
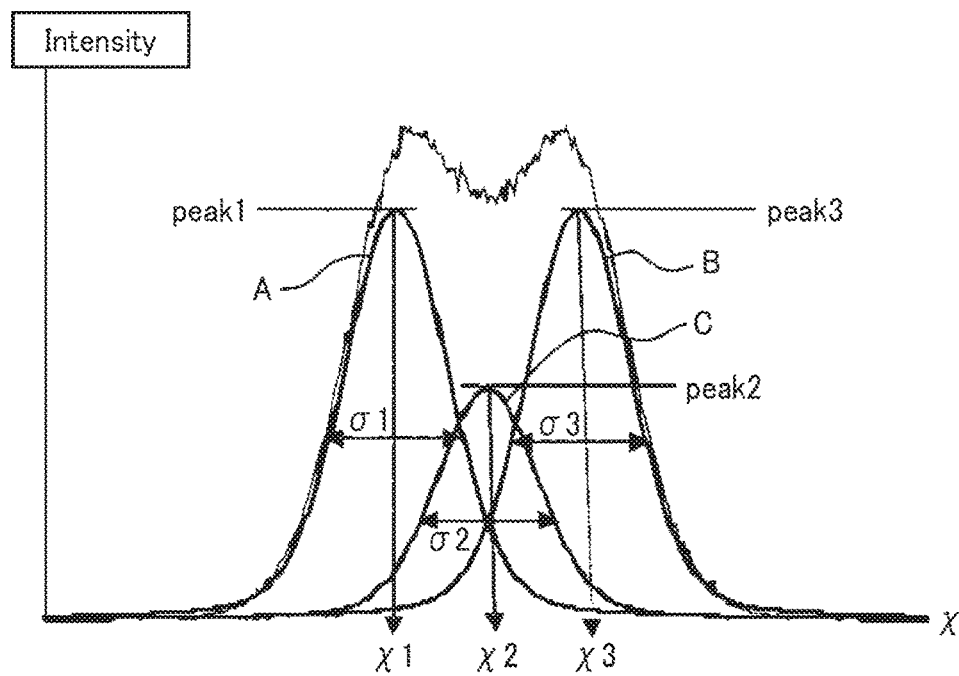
FIG. 17B is a graph illustrating an example of three diffraction peak profiles obtained by peak separation of the diffraction intensity peak profile illustrated in FIG. 17A.

FIG. 17A is a graph illustrating an example of a diffraction intensity peak profile of a (100) preferentially oriented electromechanical transducer film obtained by measurement in which the tilt angle ($\chi$) is changed. FIG. 17B is a graph illustrating an example of three separated diffraction peak profiles (i.e., constituent component peak profiles) obtained by peak separation of the diffraction intensity peak profile illustrated in FIG. 17A. The tilt angle is changed in a position (2$\theta$) at which the diffraction intensity peak corresponding to the (200) plane is the maximum among the diffraction intensity peak profiles obtained by the measurement according to the $\theta$-2$\theta$ method. In FIGS. 17A and 17B, the vertical axis indicates a diffraction intensity of a diffraction X-ray reflected from a measurement plane, and the horizontal axis indicates a tilt angle ($\chi$).

As illustrated in FIG. 17B, the diffraction intensity peak profile obtained by changing the tilt angle ($\chi$) can be separated to three separated diffraction peak profiles by peak separation. Hence, in the diffraction intensity peak profile shown in FIG. 17A, a plurality of peak profiles corresponding to a plurality of crystal planes are superimposed into a single peak profile. The diffraction intensity peak profile shown in FIG. 17A can be separated into three peak profiles "A", "B", and "C" by the peak separation as shown in FIG. 17B.

In the peak profiles "A", "B", and "C" shown in FIG. 17B, the maximum peak intensities are set to "peak1", "peak2", and "peak3", respectively. In the peak profiles "A", "B", and "C" shown in FIG. 17B, tilt angles corresponding to the maximum peak intensities are set to "$\chi$1", "$\chi$2", and "$\chi$3", respectively. Further, half-value widths ($\chi$) of the peak profiles "A", "B", and "C" shown in FIG. 17B are set to "σ1", "σ2", and "σ3", respectively. Here, a half-value width ($\chi$) is a width of $\chi$ at which the diffraction intensity is equal to a value of half of the maximum peak intensity.

The half-value width ($\chi$) is an indicator for determining whether an amount of deformation of an electromechanical transducer element is sufficiently great. However, if a peak profile in which a plurality of peak profiles corresponding to a plurality of crystal planes are superimposed is treated as one peak profile without separating the peak profile, it is difficult to correctly determine the amount of deformation of the electromechanical transducer element.

When the above described variation of Zr in the film thickness of the electromechanical transducer film is suppressed, a difference between peaks and valleys of the diffraction intensity peak profile shown in FIG. 17A becomes larger. It is thought that by suppressing the variation of Zr, the ratio of the crystal structure such as the rhombohedral crystal and the pseudo-cubic crystal decreases and the tetragonal crystal becomes higher, so that the twin plane is more likely to be formed. As the result, it is thought that the crystal face to be obliquely growing increases.

In the peak profiles "A", "B", and "C" shown in FIG. 17B, a maximum peak intensity P1 of a peak profile located between a peak profile having a minimum tilt angle among "$\chi1$", "$\chi2$", and "$\chi3$" and a peak profile having a maximum tilt angle among "$\chi1$", "$\chi2$", and "$\chi3$", is "peak2". That is, the diffraction peak profile "A" having "$\chi1$" is fourth diffraction peak, and the diffraction peak profile "B" having "$\chi3$" is sixth diffraction peak, and the diffraction peak profile "C" having "$\chi2$" is fifth diffraction peak. The maximum peak intensity P1 is the peak intensity "peak2" of fifth diffraction peak "C".

The maximum peak intensity P1 is less than both the maximum intensity "peak1" of the peak profile "A" and the maximum intensity "peak3" of the peak profile "B". Moreover, when the larger peak intensity among the maximum intensity "peak 1" and the maximum intensity "peak3" is set to P2, it is preferable that P1/P2 is 0.995 (99.5%) or less. It is further preferable that P1/P2 is 0.85 (85%) or less. P1/P2 is in such a range, so that the variation of Zr is suppressed and the amount of deformation of the electromechanical transducer element is larger. By this range of P1/P2, the ratio of the mixed structure S1=Sb/(Sa+Sb+Sc) can be not less than 1% and not greater than 60%.

It is possible to evaluate on three separated diffraction peaks obtained by peak separation of the diffraction peak profile measured (measured by changing the angle ($\omega$)) by the above rocking curve method.

Also, when the variation of Zr in the film thickness of the electromechanical transducer film is suppressed, it is easier to obtain a relatively large crystal grain size. When the crystal grain size increases, a half-value width (2$\theta$) of the diffraction intensity peak in the diffraction intensity peak profile shown in FIG. 7 tends to decrease. The half-value width (2$\theta$) is preferably 10° or less. By this range of the half-value width (2$\theta$), the ratio of the mixed structure S1=Sb/(Sa+Sb+Sc) can be not less than 1% and not greater than 60%

Here, a ratio of the diffraction peak area Sc to the sum of the diffraction peak area Sa and the diffraction peak area Sc, is represented by S2=Sc/(Sa+Sc). S2 is called as c-domain structure ratio. S2 is preferably 0.18 (18%) or less. S2 is in such a range, so that the amount of deformation accompanying the rotational strain is obtained.

Next, examples of the electromechanical transducer element 200 according to this embodiment are described with Examples and Comparative Examples. Note that the examples of the electromechanical transducer element 200 are not limited to the following examples.

EXAMPLE 1

In Example 1, a thermal oxide film ($SiO_2$, having a film thickness of 1 μm) was formed on a 6-inch silicon wafer as a substrate 21 and a diaphragm 22. The thermal oxide film becomes the substrate 21 and the diaphragm 22. Then, a lower electrode 23 was formed on a part of the diaphragm 22. The lower electrode 23 has a structure in which an adhesion layer and a metal electrode film are laminated one on the other.

A titanium film (having a film thickness of 20 nm) was formed at a film formation temperature of 350° C. by a sputtering apparatus and thermal oxidization was performed on the titanium film at 750° C. by rapid thermal annealing (RTA) treatment. Thus, the adhesion layer was formed. Subsequently, as the metal electrode film, a platinum film (having a film thickness of 160 nm) was formed at a film formation temperature of 300° C. by the sputtering apparatus.

Next, a solution (hereinafter, PT solution) in a ratio of amount of substance of Pb:Ti=1:1 as a $PbTiO_3$ layer (hereinafter, PT layer) being a base layer was prepared. As a electromechanical transducer film, a first PZT precursor solution in a ratio of amount of substance of Pb:Zr:Ti=115:55:45, a second PZT precursor solution in a ratio of amount of substance of Pb:Zr:Ti=115:49:51, and a third PZT precursor solution in a ratio of amount of substance of Pb:Zr:Ti=115:43:57 were prepared.

For synthesis of a specific precursor coating liquid, lead acetate trihydrate, titanium isopropoxide, and zirconium isopropoxide were used as starting materials. Crystal water of lead acetate was dissolved in methoxyethanol and was then dehydrated. The amount of lead is excessively large for a stoichiometric composition. This is to prevent reduction in crystallinity by so-called lead missing during heat treatment. The titanium isopropoxide and the zirconium isopropoxide were dissolved in methoxyethanol, an alcohol exchange reaction and an esterification reaction were advanced, a resultant was mixed with a methoxyethanol solution having dissolved the lead acetate, and the PZT precursor solution was synthesized. A concentration of the PZT in the PZT precursor solution was 0.5 [mol/l]. The PT solution was prepared in the same manner as the PZT precursor solution.

Next, using the PT solution, the PT layer was formed by spin coating, and dried at 120° C. by a hotplate. Then, the first PZT precursor solution including highest Zr/(Ti+Zr) among the first PZT precursor solution, the second PZT precursor solution and the third PZT precursor solution was formed by spin coating, and dried at 120° C., and thermal decomposition was performed at 400° C. Then, the second PZT precursor solution including lower Zr/(Ti+Zr) than the first PZT precursor solution was formed by spin coating, and dried at 120° C., and thermal decomposition was performed at 400° C. Then, the third PZT precursor solution including lower Zr/(Ti+Zr) than the second PZT precursor solution was formed by spin coating, and dried at 120° C., and thermal decomposition was performed at 400° C.

The processes of film formation, drying, and thermal decomposition were repeated to form three-layer laminated film. After a thermal decomposition process was applied on a third layer, crystallization heat treatment (temperature of 730° C.) was executed by rapid thermal annealing (RTA). A film thickness of the PZT was 240 nm after crystallization heat treatment. The processes were repeated eight times, that is a total of 24 layers were laminated, and an electromechanical transducer film 24 having a film thickness of about 2 µm was obtained.

Next, an upper electrode 25 was formed. A $LaNiO_3$ film (having a film thickness of 40 nm) was formed as an oxide electrode film. Further, a platinum (Pt) film (having a film thickness of 125 mm) was formed as a metal electrode film by sputtering. Then, a film was formed by the spin coating method using a photoresist (TSMR8800) manufactured by TOKYO OHKA KOGYO., LTD, a resist pattern was formed by a normal photolithographic method, and a pattern illustrated in FIGS. 3A and 3B was manufactured using an inductively coupled plasma (ICP) etching device (manufactured by SAMCO INC.).

Next, an $Al_2O_3$ film having a film thickness of 50 nm was formed as a first insulating protective film 31, using an atomic layer deposition (ALD) method. At this time, Al of trimethylaluminum (TMA: manufactured by Sigma-Aldrich Co. LLC.) and $O_3$ generated by an ozone generator are alternately supplied as raw materials, and laminated for film formation.

Next, as illustrated in FIGS. 3A and 3B, a contact-hole 32 was formed by etching. Next, as a connector 35 between a discrete electrode and a discrete electrode pad 34, an inter-pad connector 37 between a common electrode and a common electrode pad 36, a discrete electrode pad 34, and a common electrode pad 36, a film of Al was formed by sputtering and patterned by etching.

Next, as a second insulating protective film 38, a film of $Si_3N_4$ was formed at a film thickness of 500 nm by a plasma chemical vapor deposition (CVD) method. Then, openings were formed at positions of the discrete electrode pad 34 and the common electrode pad 36, and thus the electromechanical transducer element 200 was produced.

Then, with the polarization processing device 40 illustrated in FIG. 4, polarization processing was performed on the piezoelectric element 200 by corona charging. A tungsten wire of φ50 µm was used as a corona electrode used for corona charging. Polarization processing conditions were a processing temperature of 80° C., a corona voltage of 9 kV, a grid voltage of 2.5 kV, a processing time of 30 seconds, a distance between the corona electrode and the grid electrode was set to be 4 mm, and a distance between the grid electrode and a stage was set to be 4 mm.

Figure 18:
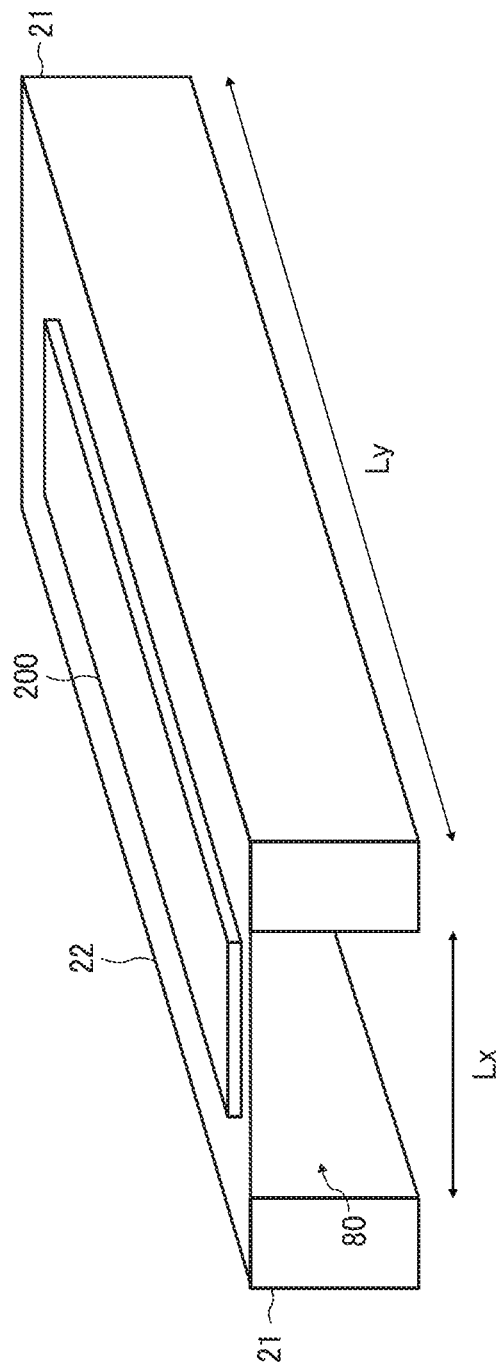
FIG. 18 is a perspective schematic view of an example of a liquid discharge head according to the present disclosure.
Figure 19:
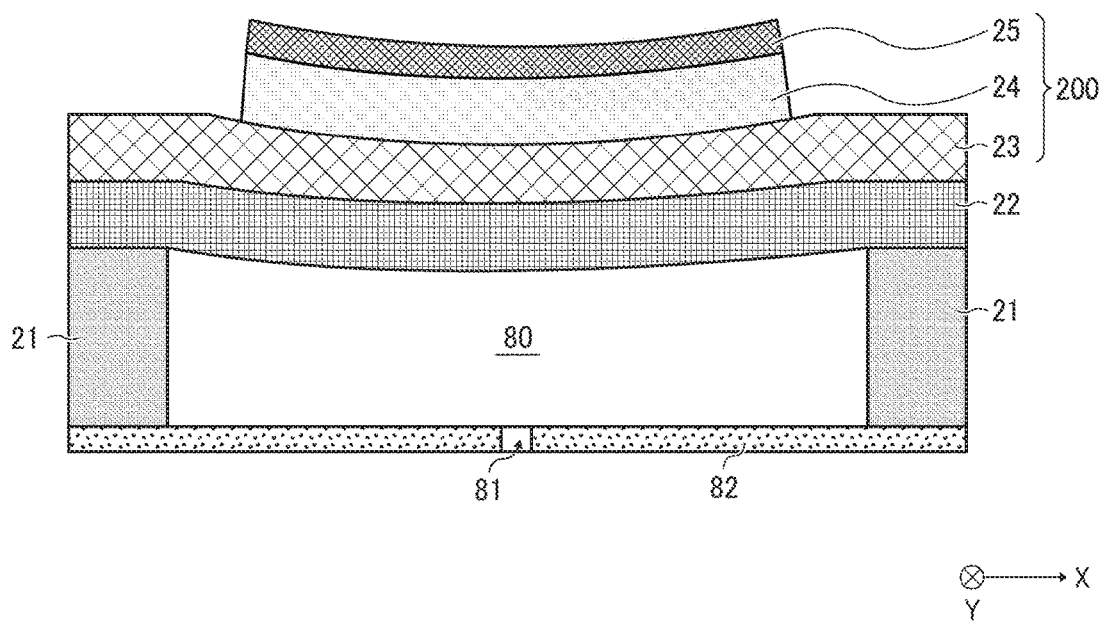
FIG. 19 is a cross-sectional view of an example of the liquid discharge head illustrated in FIG. 18.

Then, the through-hole part that becomes the pressure chamber 80 was formed in the back face of the substrate 21 as illustrated in FIG. 18. Then, the nozzle plate 82, on which the nozzles 81 are formed, was bonded to the back face of the substrate 21 to manufacture the liquid discharge head 104 as illustrated in FIG. 19. The pressure chamber 80 of the liquid discharge head 104 of the first embodiment had a first length Lx of 60 µm in the X-direction and had a second length Ly of 1000 µm in the Y-direction perpendicular to the X-direction. The distance between the discrete electrode pad 34 and the discrete electrode pad 34 was 80 µm.

EXAMPLE 2

As an electromechanical transducer film, a first PZT precursor solution in a ratio of amount of substance of Pb:Zr:Ti=115:59:41, a second PZT precursor solution in a ratio of amount of substance of Pb:Zr:Ti=115:53:47, and a third PZT precursor solution in a ratio of amount of substance of Pb:Zr:Ti=115:47:53 were prepared. Then, the electromechanical transducer element 200 and the liquid discharge head 104 were manufactured using these PZT precursor solutions as with example 1.

EXAMPLE 3

As an electromechanical transducer film, a first PZT precursor solution in a ratio of amount of substance of Pb:Zr:Ti=115:53:47, a second PZT precursor solution in a ratio of amount of substance of Pb:Zr:Ti=115:53:47, and a third PZT precursor solution in a ratio of amount of substance of Pb:Zr:Ti=115:53:47 were prepared. Then, the electromechanical transducer element 200 and the liquid discharge head 104 were manufactured using these PZT precursor solutions as with example 1.

EXAMPLE 4

As an electromechanical transducer film, a first PZT precursor solution in a ratio of amount of substance of Pb:Zr:Ti=115:65:35, a second PZT precursor solution in a ratio of amount of substance of Pb:Zr:Ti=115:53:47, and a third PZT precursor solution in a ratio of amount of substance of Pb:Zr:Ti=115:41:59 were prepared. Then, the electromechanical transducer element 200 and the liquid discharge head 104 were manufactured using these PZT precursor solutions as with example 1.

EXAMPLE 5

As an electromechanical transducer film, a first PZT precursor solution in a ratio of amount of substance of Pb:Zr:Ti=115:59:41, a second PZT precursor solution in a ratio of amount of substance of Pb:Zr:Ti=115:53:47, and a third PZT precursor solution in a ratio of amount of substance of Pb:Zr:Ti=115:47:53 were prepared. And, crystallization heat treatment (temperature of 680° C.) was executed by rapid thermal annealing (RTA). Except for the temperature in the crystallization heat treatment, the electromechanical transducer element 200 and the liquid discharge head 104 were manufactured using these PZT precursor solutions as with example 1.

EXAMPLE 6

As an electromechanical transducer film, a first PZT precursor solution in a ratio of amount of substance of Pb:Zr:Ti=115:51:49, a second PZT precursor solution in a ratio of amount of substance of Pb:Zr:Ti=115:45:55, and a third PZT precursor solution in a ratio of amount of substance of Pb:Zr:Ti=115:39:61 were prepared. Then, the electromechanical transducer element 200 and the liquid discharge head 104 were manufactured using these PZT precursor solutions as with example 1.

EXAMPLE 7

As an electromechanical transducer film, a first PZT precursor solution in a ratio of amount of substance of Pb:Zr:Ti=115:65:35, a second PZT precursor solution in a ratio of amount of substance of Pb:Zr:Ti=115:53:47, and a third PZT precursor solution in a ratio of amount of substance of Pb:Zr:Ti=115:41:59 were prepared. And, in a crystallization heat treatment process, rapid thermal annealing (RTA) was executed during supplying of $O_2$ gas to a heating, furnace. Except for the above described features, the electromechanical transducer element 200 and the liquid discharge head 104 were manufactured using these PZT precursor solutions as with example 1.

EXAMPLE 8

As an electromechanical transducer film, a first PZT precursor solution in a ratio of amount of substance of Pb:Zr:Ti=115:53:47, a second PZT precursor solution in a ratio of amount of substance of Pb:Zr:Ti=115:53:47, and a third PZT precursor solution in a ratio of amount of substance of Pb:Zr:Ti=115:53:47 were prepared. And, a TiO$_2$ layer instead of PbTiO$_3$ (PT) was used as the base layer of the electromechanical transducer film 24. And, a crystallization heat treatment (temperature of 680° C.) was executed by rapid thermal annealing (RTA). Except for the above described features, the electromechanical transducer element 200 and the liquid discharge head 104 were manufactured using these PZT precursor solutions as with example 1.

COMPARATIVE EXAMPLE 1

As an electromechanical transducer film, a first PZT precursor solution in a ratio of amount of substance of Pb:Zr:Ti=115:75:25, a second PZT precursor solution in a ratio of amount of substance of Pb:Zr:Ti=115:53:47, and a third PZT precursor solution in a ratio of amount of substance of Pb:Zr:Ti=115:31:69 were prepared. Then, the electromechanical transducer element 200 and the liquid discharge head 104 were manufactured using these PZT precursor solutions as with example 1.

COMPARATIVE EXAMPLE 2

As an electromechanical transducer film, a first PZT precursor solution in a ratio of amount of substance of Pb:Zr:Ti=115:43:57, a second PZT precursor solution in a ratio of amount of substance of Pb:Zr:Ti=115:47:53, and a third PZT precursor solution in a ratio of amount of substance of Pb:Zr:Ti=115:51:49 were prepared. Then, the electromechanical transducer element 200 and the liquid discharge head 104 were manufactured using these PZT precursor solutions as with example 1.

COMPARATIVE EXAMPLE 3

As an electromechanical transducer film, a first PZT precursor solution in a ratio of amount of substance of Pb:Zr:Ti=115:62:38, a second PZT precursor solution in a ratio of amount of substance of Pb:Zr:Ti=115:62:38, and a third PZT precursor solution in a ratio of amount of substance of Pb:Zr:Ti=115:62:38 were prepared. Then, the electromechanical transducer element 200 and the liquid discharge head 104 were manufactured using these PZT precursor solutions as with example 1.

COMPARATIVE EXAMPLE 4

As an electromechanical transducer film, a first PZT precursor solution in a ratio of amount of substance of Pb:Zr:Ti=115:38:62, a second PZT precursor solution in a ratio of amount of substance of Pb:Zr:Ti=115:38:62, and a third PZT precursor solution in a ratio of amount of substance of Pb:Zr:Ti=115:38:62 were prepared. Then, the electromechanical transducer element 200 and the liquid discharge bead 104 were manufactured using these PZT precursor solutions as with example 1.

With the electromechanical transducer element 200 produced in the above-described Examples 1 to 8 and Comparative Examples 1 to 4, crystallinity of the electromechanical transducer film 24 was evaluated by the θ-2θ measurement using an X-ray diffraction (XRD) method, and composition characteristics of the electromechanical transducer film 24 were evaluated by Transmission Electron Microscope-Energy Dispersive Spectroscopy (TEM-EDS). Here, crystallinity was evaluated after a pressure chamber 80 was formed in the substrate 21 (the state in which the piezoelectric film 24 is not constrained by the substrate 21) as illustrated in FIG. 18. A XRD apparatus used in the measurement was X' PertMRD (manufactured by Phillips). The X-ray source was CuKα and the wavelength of X-ray was 1.541 Å (0.1541 nm). Slit ¼ and Mask 15 were used.

Electric properties and deformation (surface displacement) properties (piezoelectric constant) were evaluated on each of the liquid discharge heads 104 manufactured in the above-described Examples 1 to 8 and Comparative Examples 1 to 4. In the evaluation of deformation (surface displacement) properties, the evaluation of vibration was performed after the substrate 21 was processed to form the pressure chamber 80 on the substrate 21. For example, when a drive voltage of a predetermined pulse waveform (a triangular waveform of 1 kHz) to form an electric field of 150 k/Vcm was applied on the electromechanical transducer element 200, the amount of deformation of the lower surface of the diaphragm 22 was measured with a laser Doppler vibrometer. Then, the value of piezoelectric constant d31 was calculated through matching with simulation results. After initial properties were evaluated, durability properties (properties immediately after the drive voltage having the above-described predetermined pulse waveform was repetitively applied 1×10$^{10}$ times) were evaluated.

Evaluation results of Examples 1 to 8 and Comparative Examples 1 to 4 are illustrated in the following Table 1 and Table 2 with Ti/(Ti+Zr), ΔZr1, ΔZr2, S1=Sb/(Sa+Sb+Sc), the degree of orientation of the (100) plane, and the number of fittings (e.g., the number of separated diffraction peaks to be separated of the diffraction intensity peak profile derived from the (400) plane).

TABLE 1

| | Zr in PZT precursor solution | | | | | | The number |
|---|---|---|---|---|---|---|---|
| | first | second | third | Ti/(Ti + Zr) | Δ Zr1 | Δ Zr2 | of fittings |
| EX 1 | 55 | 49 | 43 | 51% | 9% | 12% | 3 |
| EX 2 | 59 | 53 | 47 | 47% | 8% | 12% | 3 |
| EX 3 | 53 | 53 | 53 | 47% | 14% | 24% | 3 |
| EX 4 | 65 | 53 | 41 | 47% | 11% | 18% | 3 |
| EX 5 | 59 | 53 | 47 | 47% | 6% | 9% | 3 |
| EX 6 | 51 | 45 | 39 | 55% | 7% | 9% | 3 |
| EX 7 | 65 | 53 | 41 | 47% | 6% | 9% | 3 |
| EX 8 | 53 | 53 | 53 | 47% | 15% | 25% | 3 |
| CE 1 | 75 | 53 | 31 | 47% | 21% | 35% | 3 |
| CE 2 | 43 | 47 | 51 | 53% | 14% | 24% | 4 |
| CE 3 | 62 | 62 | 62 | 38% | 18% | 32% | 2 |
| CE 4 | 38 | 38 | 38 | 62% | 17% | 29% | 3 |

TABLE 2

| | Sb/(Sa + Sb + Sc) | Degree of orientation ρ$_{(100)}$ of the (100) plane | d31 INITIAL | d31 AFTER | EVALUATION |
|---|---|---|---|---|---|
| EX 1 | 0.210 | 99.3% | −172 | −163 | VERY GOOD |
| EX 2 | 0.282 | 99.4% | −169 | −167 | VERY GOOD |
| EX 3 | 0.532 | 99.1% | −142 | −141 | GOOD |
| EX 4 | 0.421 | 95.3% | −149 | −148 | GOOD |
| EX 5 | 0.214 | 99.2% | −179 | −177 | VERY GOOD |
| EX 6 | 0.032 | 99.6% | −165 | −152 | GOOD |

TABLE 2-continued

| | Sb/(Sa + Sb + Sc) | Degree of orientation ρ(100) of the (100) plane | d31 INITIAL | d31 AFTER | EVALUATION |
|---|---|---|---|---|---|
| EX 7 | 0.156 | 99.8% | −189 | −187 | VERY GOOD |
| EX 8 | 0.593 | 76.5% | −131 | −122 | ACCEPTABLE |
| CE 1 | 0.682 | 84.2% | −121 | −114 | POOR |
| CE 2 | 0.547 | 99.2% | −118 | −112 | POOR |
| CE 3 | — | 84.3% | −104 | −90 | POOR |
| CE 4 | 0.005 | 93.2% | −123 | −96 | POOR |

Criteria in Table 2 are described below.

Very Good: the electromechanical transducer element 200 having the piezoelectric constant (the absolute value) d31 after the durability test of not less than 160 pm/V.

Good: the electromechanical transducer element 200 having the piezoelectric constant (the absolute value) d31 after the durability test of not less than 140 pm/V and less than 160 pm/V.

Acceptable: the electromechanical transducer element 200 having the piezoelectric constant (the absolute value) d31 after the durability test of not less than 120 pm/V and less than 140 pm/V.

Poor: the electromechanical transducer element 200 having the piezoelectric constant (the absolute value) d31 after the durability test of less than 120 pm/V.

From the test results of the initial properties and the deformation (surface displacement) properties after durability test, it was found that Examples 1 to 8 had the same properties as those of a typical ceramic sintered object. Converting into the value of piezoelectric constant d31, properties in the range of from −120 pm/V to −160 pm/V were obtained as initial properties and as properties after the durability test. The initial properties and the properties after the durability test of the piezoelectric constant d31 of Comparative Examples 1 to 4 were inferior to that of Examples 1 to 8 described above. Especially, the piezoelectric constant (the absolute value) d31 after the durability test were lower than 120 pm/V.

In Comparative Example 3, the number of fittings was two, and the fitting residue was too large to calculate the mixed structure ratio S1=Sb/(Sa+Sb+Sc).

In Comparative Example 2, the number of fittings was four, and the diffraction intensity peak profile derived from the (400) plane was separated into four separated diffraction peaks. Specifically, the diffraction intensity peak profile derived from the (400) plane was separated into a separated diffraction peak attributed to the tetragonal a-domain structure X1, a separated diffraction peak attributed to the tetragonal c-domain structure Y1, a separated diffraction peak attributed to a rhombohedral domain structure Z1−1, and a separated diffraction peak attributed to an orthorhombic domain or pseudo-cubic structure Z1−2. When S1=Sb/(Sa+Sb+Sc) was calculated, Sb was larger than the diffraction peak area among the diffraction peak area of separated diffraction peak attributed to the rhombohedral domain structure Z1−1 and the diffraction peak area of separated diffraction peak attributed to the orthorhombic domain or pseudo-cubic structure Z1−2. As a result, S1 was 0.547 (54.7%), that was less than 0.60 (60%). However, the property of piezoelectric constant d31 was "Poor". On the other hand, if Sb was the sum of the diffraction peak area of separated diffraction peak attributed to the rhombohedral domain structure Z1−1 and the diffraction peak area of separated diffraction peak attributed to the orthorhombic domain or pseudo-cubic structure Z1−2, S1 was 0.72 (72%), that was more than 0.60 (60%).

In Comparative Example 4, S1=Sb(Sa+Sb+Sc) was very small because Ti/(Ti+Zr) was high, i.e., the ratio of the tetragonal structure was high. The initial piezoelectric constant d31 was more than 120 pm/V. However, the piezoelectric constant d31 after the durability test was 96 pm/V.

Next, a description is given of the liquid discharge apparatus 500 including the liquid discharge head 104 according to an embodiment of the present disclosure.

Figure 20:
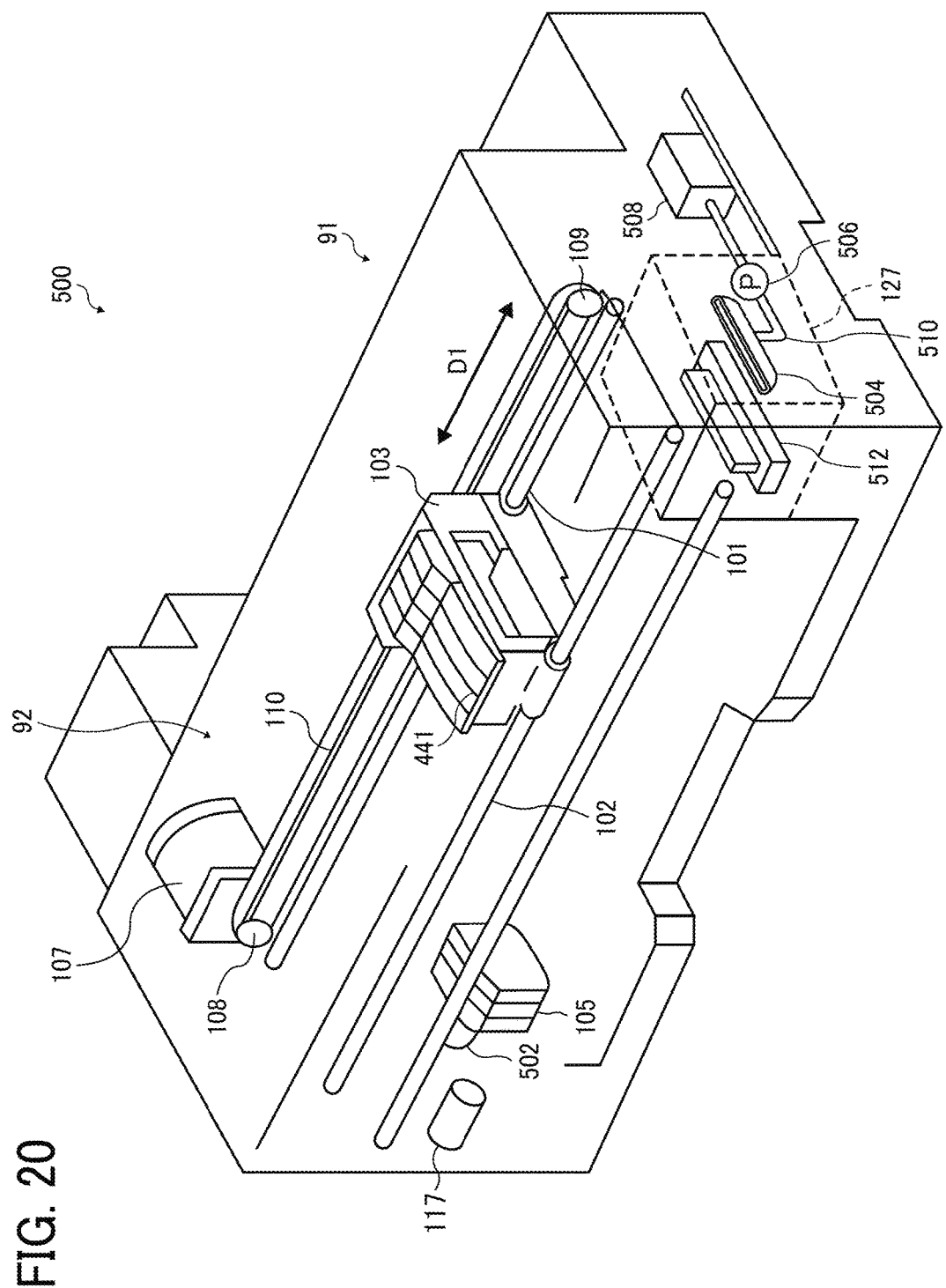
FIG. 20 is a perspective view of an example of a liquid discharge apparatus according to the present disclosure.
Figure 21:
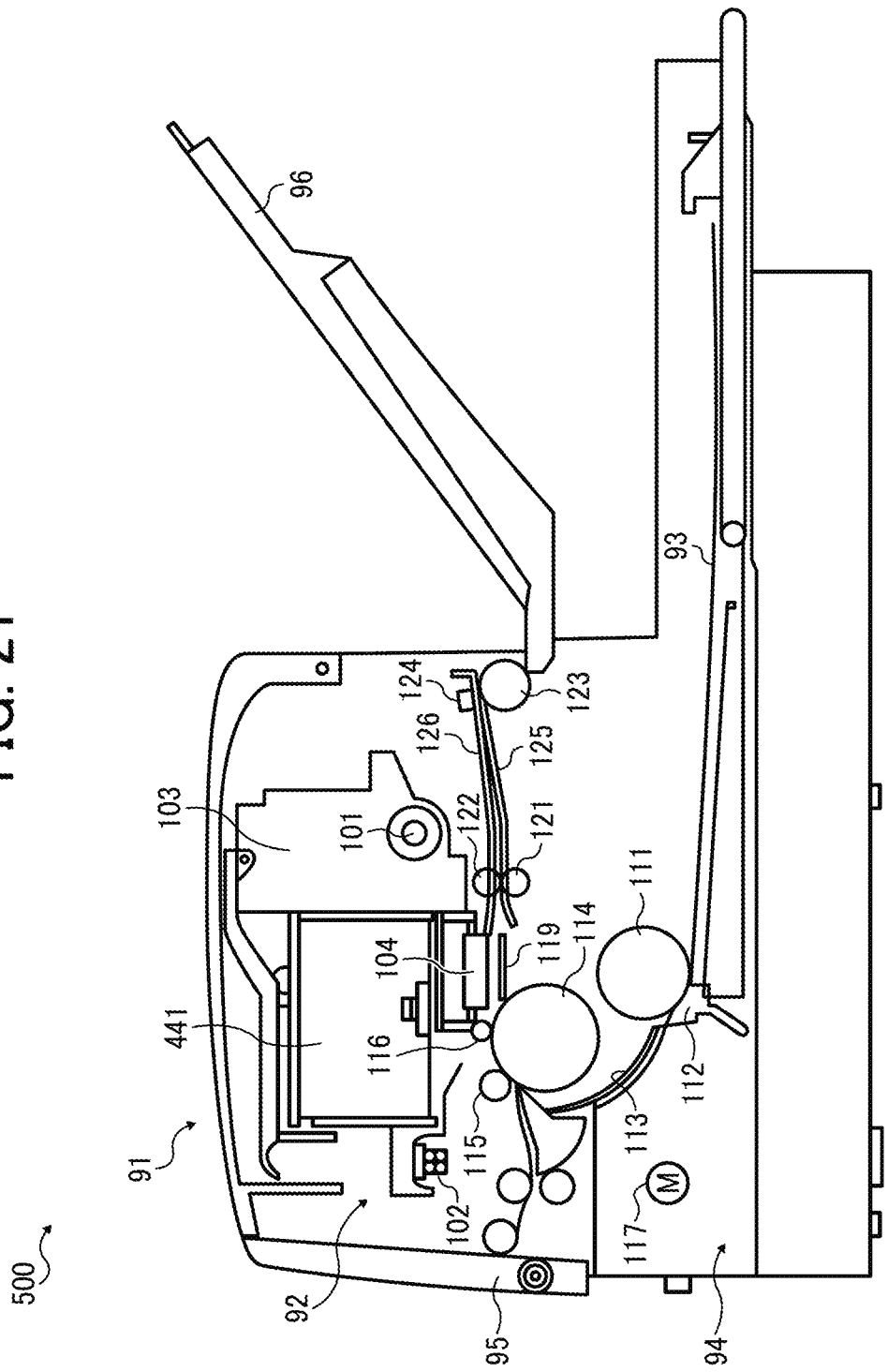
FIG. 21 is a side view of the liquid discharge apparatus illustrated in FIG. 20.

FIG. 20 is a perspective view of an example of a liquid discharge apparatus 500 according to an embodiment of the present disclosure. FIG. 21 is a side view of an example of a mechanical section of the liquid discharge apparatus 500 of FIG. 20. In FIGS. 20 and 21, an inkjet recording apparatus being an image forming apparatus is illustrated as an example of the liquid discharge apparatus 500.

The liquid discharge apparatus 500 according to this embodiment includes, e.g., a printing assembly 92 inside a recording apparatus body 91. The printing assembly 92 includes, e.g., a carriage 103, liquid discharge heads 104, and ink cartridges 105. The carriage 103 is movable in a main scanning direction indicated by arrow D1 in FIG. 20. The liquid discharge heads 104 and head-tanks 441 are mounted on the carriage 103. The ink cartridges 105 supply ink to the head-tanks 441 and liquid discharge heads 104 via supply tubes 502.

A sheet feeding cassette (or a sheet feeding tray) 94 is detachably mountable to a lower portion of the recording apparatus body 91. From the front side of the recording apparatus body 91, a plurality of sheets 93 can be stacked on the sheet feeding cassette 94. A bypass tray 95 is disposed at an angle to the recording apparatus body 91 to be openable so that a user can manually stack sheets 93 on the bypass tray 95. When a sheet 93 fed from the sheet feeding cassette 94 or the bypass tray 95 is taken in, the printing assembly 92 records a desired image on the sheet 93. Then, the sheet 93 is ejected to a sheet ejection tray 96 mounted on a back face side of the recording apparatus body 91.

Figure 23:
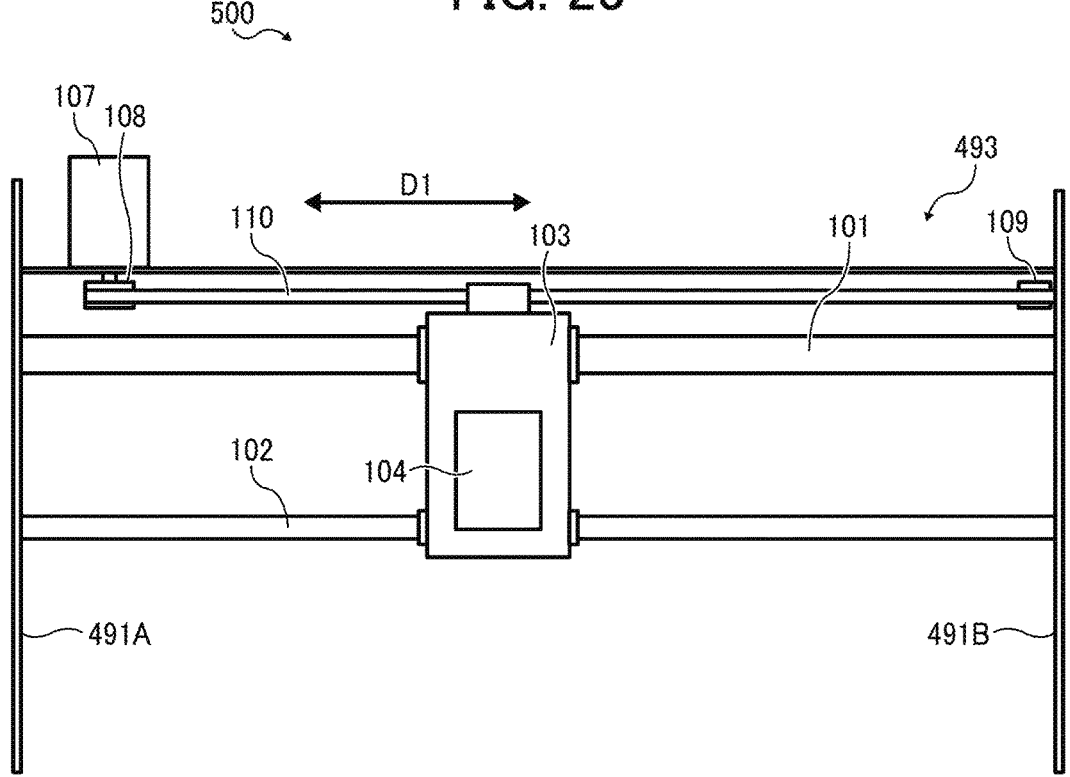
FIG. 23 is a plan view of another example of a liquid discharge device according to the present disclosure.

In the printing assembly 92, a main-guide rod 101 and a sub-guide rod 102 support the carriage 103 slidably in the main scanning direction D1. The main-guide rod 101 and the sub-guide rod 102 act as guides of the carriage 103 and are laterally bridged between left and right side plates 491A and 491B as illustrated in FIG. 23. The carriage 103 mounts the liquid discharge heads 104 configured to discharge ink droplets of different colors of yellow (Y), cyan (C), magenta (M), and black (Bk) from the nozzles 81 of the liquid discharge heads 104. The nozzles 81 are arrayed in a direction perpendicular to the main scanning direction D1. The liquid discharge heads 104 are mounted on the carriage 103 such that ink discharge directions are oriented downward. The liquid discharge apparatus 500 also detachably mounts the ink cartridges 105 to supply different colors of ink to the head-tanks 441 and the liquid discharge heads 104.

Each of the ink cartridges 105 has an atmosphere communication port at an upper portion thereof to communicate with the atmosphere, a supply port at a lower portion thereof to supply ink to the liquid discharge heads 104, and a porous body inside to be filled with ink. Ink to be supplied to the liquid discharge heads 104 is maintained at a slightly negative pressure by capillary force of the porous body of each ink cartridge 105. In this example, the plurality of liquid discharge heads 104 is used in the liquid discharge apparatus 500. However, in some embodiments, a single liquid discharge head 104 having nozzles 81 to discharge different colors of ink droplets may be used as the liquid discharge head 104.

Note that a rear side of the carriage 103 (downstream in a sheet conveyance direction) is slidably fitted to the main-guide rod 101, and a front side of the carriage 103 (upstream in the sheet conveyance direction) is slidably fitted to the sub-guide rod 102. A timing belt 110 is stretched taut between a driving pulley 108, which is driven by a main scanning motor 107 to rotate, and a driven pulley 109, to move the carriage 103 for scanning in the main scanning direction D1. The timing belt 110 is secured to the carriage 103, and the carriage 103 is reciprocally moved by the forward and reverse rotation of the main scanning motor 107.

Next, a description is given of a conveyance assembly acting as a conveyor to convey a sheet 93, which is set in the sheet feeding cassette 94, to a position below the liquid discharge heads 104. The conveyance assembly includes a sheet feed roller 111 and a friction pad 112 to separate and feed the sheet 93 from the sheet feeding cassette 94, a guide 113 to guide the sheet 93, and a conveyance roller 114 to reverse and convey the sheet 93 fed from the sheet feeding cassette 94. The conveyance assembly further includes a conveyance roller 115 pressed against a circumferential surface of the conveyance roller 114 and a leading end roller 116 to define an angle at which the sheet 93 is fed from the conveyance roller 114. The conveyance roller 114 is driven for rotation by a sub-scanning motor 117 via a gear train.

The conveyance assembly further includes a print receiver 119 as a sheet guide to guide the sheet 93, which is fed from the conveyance roller 114, in accordance with a range of movement of the carriage 103 in the main scanning direction D1. The liquid discharge apparatus 500 further includes a conveyance roller 121 and a spur roller 122 downstream from the print receiver 119 in the sheet conveyance direction such that the conveyance roller 121 and the spur roller 122 are rotationally driven to convey the sheet 93 in a sheet ejection direction. The liquid discharge apparatus 500 further includes a sheet ejection roller 123 and a spur roller 124 to feed the sheet 93 to the sheet ejection tray 96, and guides 125 and 126 forming a sheet ejection path.

When the liquid discharge apparatus 500 performs recording, the liquid discharge apparatus 500 drives the liquid discharge heads 104 in accordance with image signals while moving the carriage 103, discharges ink onto the stopped sheet 93 to record one line on the sheet 93, feeds the sheet 93 by a predetermined amount, and then records a next line on the sheet 93. When the liquid discharge apparatus 500 receives a recording end signal or a signal indicating the arrival of a trailing end of the sheet 93 at a recording area, the liquid discharge apparatus 500 terminates a recording operation and ejects the sheet 93.

Further, the liquid discharge apparatus 500 includes a recovery device 127 to recover the liquid discharge heads 104 from a discharge failure. The recovery device 127 is disposed at a non-recording area that is located at a right end side of the liquid discharge apparatus 500 in the main scanning direction D1 in FIG. 20. The recovery device 127 includes a capping device 504, a suction device 506, and a cleaning device 512. During standby for printing, the carriage 103 is moved toward the recovery device 127 and the liquid discharge heads 104 are capped with the capping device 504. Thus, the nozzles 81 of the liquid discharge heads 104 are maintained in humid state, thus preventing discharge failure due to drying of ink. In addition, for example, during recording, ink not relating to the recording is discharged to the capping device 504 to maintain the viscosity of ink in the entire nozzles 81 constant, thus maintaining stable discharging performance.

When a discharge failure occurs, the nozzles 81 of the liquid discharge heads 104 are sealed by the capping device 504 and ink, and bubbles are sucked from the nozzles 81 by the suction device 506, such as a pump, through a tube 510. The cleaning device 512 removes ink and dust adhered to a surface of the nozzle plate 82, thus recovering the discharge failure. In addition, the sucked ink is drained to a waste ink container 508 disposed on a lower portion of the recording apparatus body 91, is absorbed into an ink absorber in the waste ink container 508, and is retained in the ink absorber.

The liquid discharge apparatus 500 according to this embodiment includes the above-described liquid discharge heads 104. Accordingly, the electromechanical transducer elements of the liquid discharge head 104 secure a sufficient amount of deformation (amount of surface displacement) to preferably maintain ink discharge properties and sufficiently suppress degradation of the amount of deformation (the amount of surface displacement) even after continuous discharge, thus allowing the liquid discharge apparatus 500 to perform stable ink discharge.

The image forming apparatus (the inkjet recording apparatus) as the liquid discharge apparatus 500 according to this embodiment mounts the liquid discharge heads 104 according to any of the above-described Examples 1 to 8.

The liquid discharge heads 104 were produced using the piezoelectric elements prepared in Examples 1 to 8, and the liquid discharge heads 104 were evaluated for the discharging performance of ink using the liquid discharge apparatus 500. Observing a discharged state when a voltage of from −10 V to −30 V was applied by a simple push waveform using ink of which viscosity was adjusted to 5 cp, it was confirmed that ink droplets were discharged from all of the nozzles.

On the other hand, when the liquid discharge heads 104 of Comparative Examples 1 to 4 were evaluated for the same discharging performance as described-above, the voltage necessary for discharging ink from entire nozzles of the liquid discharge heads 104 was higher than that of the liquid discharge heads 104 of Examples 1 to 8. The discharge status of the liquid discharge heads 104 of Comparative Examples 1 to 4 were unstable.

In the present disclosure, the liquid discharge apparatus 500 includes the liquid discharge head 104 or the liquid discharge device 440, and drives the liquid discharge head 104 to discharge liquid. The liquid may be, for example, an apparatus capable of discharging liquid to a material, to which liquid can adhere, and an apparatus to discharge liquid toward gas or into liquid.

The liquid discharge apparatus may include devices to feed, convey, and eject the material on which liquid can adhere. The liquid discharge apparatus 500 may further include a pretreatment apparatus to coat a treatment liquid onto the material, and a post-treatment apparatus to coat a treatment liquid onto the material, onto which the liquid has been discharged.

The liquid discharge apparatus may be, for example, an image forming apparatus to form an image on a sheet by discharging ink, or a three-dimensional apparatus to discharge a molding liquid to a powder layer in which powder material is formed in layers, so as to form a three-dimensional article.

In addition, the liquid discharge apparatus is not limited to such an apparatus to form and visualize meaningful images, such as letters or figures, with discharged liquid. For example, the liquid discharge apparatus may be an apparatus to form meaningless images, such as meaningless patterns, or fabricate three-dimensional images.

The above-described term "material on which liquid can be adhered" represents a material on which liquid is at least temporarily adhered, a material on which liquid is adhered and fixed, or a material into which liquid is adhered to permeate. Examples of the "material on which liquid can be adhered" include recording media, such as paper sheet, recording paper, recording sheet of paper, film, and cloth, electronic component, such as electronic substrate and piezoelectric element, and media, such as powder layer, organ model, and testing cell. The "material on which liquid can be adhered" includes any material on which liquid is adhered, unless particularly limited.

Examples of the material on which liquid can be adhered include any materials on which liquid can be adhered even temporarily, such as paper, thread, fiber, fabric, leather, metal, plastic, glass, wood, ceramic, building materials, such as wall paper or flooring, textile, such as clothing.

In the present disclosure, discharged liquid is not limited to a particular liquid as long as the liquid has a viscosity or surface tension to be discharged from a liquid discharge head. However, preferably, the viscosity of the liquid is not greater than 30 mPa·s under ordinary temperature and ordinary pressure or by heating or cooling.

Examples of the liquid include a solution, a suspension, or an emulsion including, for example, a solvent, such as water or an organic solvent, a colorant, such as dye or pigment, a functional material, such as a polymerizable compound, a resin, a surfactant, a biocompatible material, such as DNA, amino acids, protein, or calcium, and an edible material, such as a natural colorant. Such a solution, a suspension, or an emulsion can be used for, e.g., inkjet ink, surface treatment solution, a liquid for forming components of electronic element or light-emitting element or a resist pattern of electronic circuit, or a material solution for three-dimensional fabrication. Examples of the liquid are, e.g., ink, treatment liquid, DNA sample, resist, pattern material, binder, mold liquid, or solution and dispersion liquid including amino acids, protein, or calcium.

The liquid discharge apparatus may be an apparatus to relatively move a liquid discharge head and a material on which liquid can be adhered. However, the liquid discharge apparatus is not limited to such an apparatus. For example, the liquid discharge apparatus may be a serial head apparatus that moves the liquid discharge head or a line head apparatus that does not move the liquid discharge head.

Examples of the liquid discharge apparatus further include a treatment liquid coating apparatus to discharge a treatment liquid to a sheet to coat the treatment liquid on the surface of the sheet to reform the sheet surface and an injection granulation apparatus in which a composition liquid including raw materials dispersed in a solution is injected through nozzles to granulate fine particles of the raw materials.

The liquid discharge device 440 is an integrated unit of the liquid discharge head 104 and an external component(s), such as a functional part(s) or mechanism(s), and is an assembly of parts relating to liquid discharge. For example, the liquid discharge device may be a combination of the liquid discharge head (e.g., the liquid discharge head 104) with at least one of a head-tank (e.g., the head-tank 441), a carriage (e.g., the carriage 103), a supply unit, a maintenance unit (e.g., the recovery device 127), and a main-scanning-moving device 493 (e.g., the timing belt 110, the driving pulley 108, the main scanning motor 107, and the driven pulley 109 as illustrated in FIGS. 20 and 23).

Here, examples of the integrated unit include a combination in which the liquid discharge head and a functional part(s) are secured to each other through, e.g., fastening, bonding, or engaging, and a combination in which one of the liquid discharge head 104 and a functional part(s) is movably held by another. The liquid discharge head 104 may be detachably attached to the functional part(s) or unit(s) each other.

Figure 22:
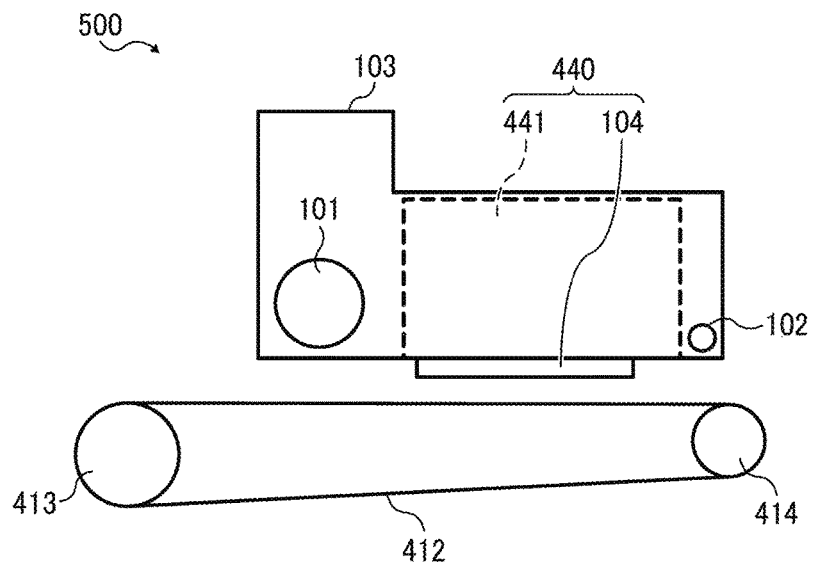
FIG. 22 is a cross-sectional view of an example of a liquid discharge device according to the present disclosure.
Figure 24:
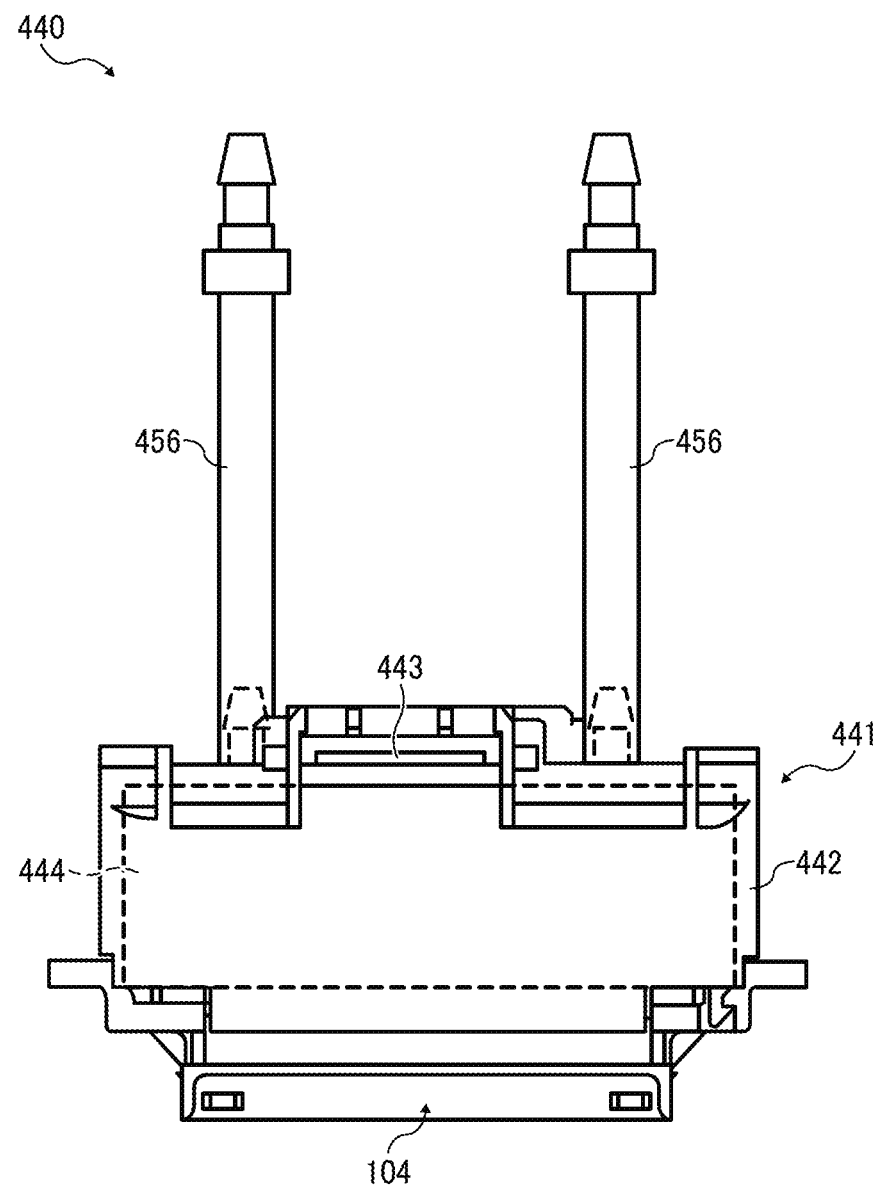
FIG. 24 is a schematic view of another example of a liquid discharge device according to the present disclosure.

FIG. 22 is a cross-sectional view of a liquid discharge apparatus 500. The liquid discharge head 104 and a head-tank 441 are integrated as the liquid discharge device 440 as illustrated in FIG. 22 and FIG. 24. The liquid discharge head 104 and the head-tank 441 may be connected each other via, e.g., a tube to integrally form the liquid discharge device. A filter may further be added to a portion between the head-tank 441 and the liquid discharge head 104.

The liquid discharge device includes a conveyor belt 412 and rollers 413 and 414 for driving the conveyor belt 412. The conveyor belt 412 and the rollers 413 and 414 act as a conveyor to convey the sheets 93 at a position facing the liquid discharge head 104. The conveyor belt 412 is an endless belt. The conveyor belt 412 is stretched between the rollers 413 and 414. The conveyor belt 412 attracts the sheet 93. The attraction can be achieved by using electrostatic attraction or air suction.

In another example, the liquid discharge device 440 may be an integrated unit in which a liquid discharge head 104 is integrated with a carriage 103.

FIG. 23 is a plan view of a liquid discharge device 440. As illustrated in FIG. 23, the liquid discharge device 440 includes the carriage 103 mounting the liquid discharge head 104 movably held by the main-guide rod 101 and the sub-guide rod 102 that form part of a main-scanning-moving device 493, so that the liquid discharge head 104, the carriage 103, and the main-scanning-moving device 493 are integrated as a single unit. Thus, the liquid discharge device 440 may be an integrated unit in which the liquid discharge head 104, the carriage 103, and the main-scanning-moving device 493 are integrally formed as a single unit.

The liquid discharge device 440 is a serial device. A main-scanning-moving device 493 reciprocally scans the carriage 103 in a main scanning direction D1 as illustrated by the arrow in FIG. 23. The main-scanning-moving device 493 includes the main-guide rod 101, the sub-guide rod 102, the main scanning motor 107, and the timing belt 110. The main-guide rod 101 is bridged between left and right side plates 491A and 491B to movably hold the carriage 103. The carriage 103 reciprocally moves in the main scanning direction by the main scanning motor 107 through the timing belt 110 stretched between a driving pulley 108 and a driven pulley 109. The liquid discharge head 104 is installed in the carriage 103 and is integrated with the head-tank 441. The liquid discharge head 104 is installed in the carriage 103 in such a manner that the discharging direction is directed downward as illustrated in FIG. 22.

In another example, the capping device 504 that forms part of the recovery device 127 is secured to the carriage 103 mounting the liquid discharge head 104 so that the liquid discharge head 104, the carriage 103, and the recovery device 127 are integrated as a single unit to form the liquid discharge device 440.

FIG. 24 is a schematic view of an example of the liquid discharge device 440. The liquid discharge device 440 includes the liquid discharge head 104 and the head-tank 441. The head-tank 441 includes a flow channel component 444, a cover 442, a connector 443, and tubes 456.

The tubes 456 are connected to the flow channel component 444. The flow channel component 444 is disposed inside the cover 442. At the upper portion of the flow channel component 444, the connector 443 is provided, which is for establishing electrical coupling with the liquid discharge head 104. The head-tank 441 acts as a supply assembly so that the liquid discharge head 104 is supplied with liquid through, the tubes 456 and the flow channel component 444 of the head-tank 441. The head-tank 441 is mounted on the liquid discharge head 104 so that the liquid discharge head 104, head-tank 441, and tubes 456 are integrated as a single unit.

The main-scanning-moving device 493 may be only a guide member such as the main-guide rod 101 and the sub-guide rod 102. The supply unit may be tubes 456 only or a loading unit to load the ink cartridges 105 only.

The above-described terms "image forming", "recording", "printing", "photography", and "fabricating" in the present disclosure have the same meaning.

The above-described embodiments are limited examples, and the present disclosure includes, for example, the following aspects having advantageous effects.

What is claimed is:

1. An electromechanical transducer element comprising:
a lower electrode formed directly or indirectly on a substrate;
an electromechanical transducer film formed on the lower electrode, comprising lead zirconate titanate (PZT) having a perovskite crystal structure; and
an upper electrode formed on the electromechanical transducer film,
wherein a value of Ti/(Zr+Ti) is not less than 40% and not greater than 55%,
where Ti/(Zr+Ti) represents a composition ratio of Titanium (Ti) to a sum of Zirconium (Zr) and Ti in the electromechanical transducer film,
wherein when a diffraction peak derived from a (200) plane or a (400) plane of the electromechanical transducer film obtained by a θ-2θ scanning measurement using an X-ray diffraction (XRD) method is separated by a peak separation to a first diffraction peak attributed to a tetragonal a-domain structure, a second diffraction peak attributed to any one of a rhombohedral structure, an orthorhombic structure and a pseudo-cubic structure, and a third diffraction peak attributed to a tetragonal c-domain structure,
then a ratio Sb/(Sa+Sb+Sc) is not less than 1% and not greater than 60%,
wherein Sa represents a diffraction peak area of the first diffraction peak, Sb represents a diffraction peak area of the second diffraction peak, Sc represents a diffraction peak area of the third diffraction peak.

2. The electromechanical transducer element according to claim 1,
wherein the electromechanical transducer film is formed by laminating a plurality of PZT films,
wherein Zr/(Zr+Ti) varies in a film thickness direction of the electromechanical transducer film,
wherein ΔZr1 is 15% or less,
where ΔZr1 represents the greater of two values, (i) and (ii), where value (i) is Zr/(Zr+Ti)_max−Zr/(Zr+Ti)_ave and value (ii) is Zr/(Zr+Ti)_ave−Zr/(Zr+Ti)_min,
where Zr/(Zr+Ti)_ave represents an average value of Zr/(Zr+Ti) in the film thickness direction of the electromechanical transducer film, Zr/(Zr+Ti)_max represents a maximum value of Zr/(Zr+Ti) in one PZT film of the plurality of PZT films, and Zr/(Zr+Ti)_min represents a minimum value of Zr/(Zr+Ti) in one PZT film of the plurality of PZT films.

3. The electromechanical transducer element according to claim 1,
wherein when a diffraction intensity peak obtained by a measurement in which a tilt angle (χ) is changed at a position (2θ) at which a peak intensity is maximum among the diffraction peak derived from the (200) plane of the electromechanical transducer film obtained by the θ-2θ scanning measurement using the X-ray diffraction (XRD) method, is separated by the peak separation to a fourth diffraction peak, a fifth diffraction peak and a sixth diffraction peak,
and when a tilt angle corresponding to a maximum peak intensity in the fifth diffraction peak is positioned between a tilt angle corresponding to a maximum peak intensity in the fourth diffraction peak and a tilt angle corresponding to a maximum peak intensity in the sixth diffraction peak,
then P1 is less than both the maximum peak intensity in, the fourth diffraction peak and the maximum peak intensity in the sixth diffraction peak, and P1/P2 is 99.5% or less,
where P1 represents the maximum peak intensity in the fifth diffraction peak, and P2 represents a larger peak intensity among the maximum peak intensity in the fourth diffraction peak and the maximum peak intensity in the sixth diffraction peak.

4. The electromechanical transducer element according to claim 1,
wherein a degree of orientation $\rho_{(100)}$ of a (100) plane of the electromechanical transducer film is not less than 95%,
where a degree of orientation $\rho_{(hkl)}$ of (hkl) plane of the electromechanical transducer film is represented by the formula of $\rho_{(hkl)}=I_{(hkl)}/\Sigma I_{(hkl)}$, and
where $I_{(hkl)}$ represents a peak intensity of a diffraction peak derived from a given (hkl) plane obtained by the θ-2θ scanning measurement using the X-ray diffraction (XRD) method on the electromechanical transducer film, and $\Sigma I_{(hk1)}$ represents a total sum of peak intensities of a plurality of diffraction peaks obtained by the θ-2θ scanning measurement using the X-ray diffraction (XRD) method on the electromechanical transducer film.

5. The electromechanical transducer element according to claim 1,
wherein a half-value width of a diffraction peak derived from the (200) plane of the electromechanical transducer film obtained by the θ-2θ scanning measurement using the X-ray diffraction (XRD) method is 10° or less.

6. The electromechanical transducer element according to claim 1,
wherein a position (2θ) corresponding to a maximum peak intensity in a diffraction peak derived from the (200) plane of the electromechanical transducer film obtained by the θ-2θ scanning measurement using the X-ray diffraction (XRD) method is not less than 44.50° and not greater than 44.80°.

7. The electromechanical transducer element according to claim 1,
wherein Sc/(Sa+Sc) is 18% or less.

8. The electromechanical transducer element according to claim 1, wherein the diffraction peak derived from the (200) plane or the (400) plane of the electromechanical transducer film is asymmetric.

9. The electromechanical transducer element according to claim 1,
further comprising a seed layer comprising lead titanate (PT) between the electromechanical transducer film and the lower electrode.

10. A liquid discharge head comprising:
a nozzle configured to discharge liquid;
a pressuring liquid chamber in liquid communication with the nozzle; and
a pressure generator configured to generate pressure to liquid in the pressuring liquid chamber,
wherein the pressure generator is the electromechanical transducer element according to claim 1.

11. A liquid discharge device comprising:
a liquid discharge head configured to discharge liquid; and
a head-tank configured to supply liquid to the liquid discharge head,
wherein the liquid discharge head is the liquid discharge head according to claim 10.

12. A liquid discharge apparatus comprising:
a liquid discharge head configured to discharge liquid; and
a conveyor configured to convey medium to the liquid discharge head,
wherein the liquid discharge head is the liquid discharge head according to claim 10.

* * * * *